US012635234B2

(12) United States Patent
Lee et al.

(10) Patent No.: US 12,635,234 B2
(45) Date of Patent: May 19, 2026

(54) SEMICONDUCTOR DEVICE HAVING OVERLAY STRUCTURES IN A KEY REGION

(71) Applicant: SAMSUNG ELECTRONICS CO., LTD., Suwon-si (KR)

(72) Inventors: Moosong Lee, Suwon-si (KR); Jinsun Kim, Suwon-si (KR); Inho Kwak, Suwon-si (KR); Dohyeon Park, Suwon-si (KR); Yeeun Han, Suwon-si (KR); Sang-Ho Yun, Suwon-si (KR); Seungyoon Lee, Suwon-si (KR); Nanhyung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 595 days.

(21) Appl. No.: 18/140,789

(22) Filed: Apr. 28, 2023

(65) Prior Publication Data

US 2023/0411393 A1 Dec. 21, 2023

(30) Foreign Application Priority Data

May 30, 2022 (KR) ........................ 10-2022-0066323

(51) Int. Cl.
*G03F 7/00* (2006.01)
*H01L 21/66* (2006.01)
(Continued)

(52) U.S. Cl.
CPC ....... *H10D 84/853* (2025.01); *G03F 7/70633* (2013.01); *G03F 7/70683* (2013.01); *H01L 22/30* (2013.01); *H01L 22/32* (2013.01);

*H10B 12/01* (2023.02); *H10B 12/34* (2023.02); *H10B 12/482* (2023.02); *H10B 12/485* (2023.02);
(Continued)

(58) Field of Classification Search
CPC ............ G03F 7/70633; G03F 7/70683; G03F 7/70658; H01L 22/30; H01L 22/32; H10B 12/01; H10B 12/34; H10B 12/482; H10B 12/485
See application file for complete search history.

(56) References Cited

U.S. PATENT DOCUMENTS 6,048,649 A 4/2000 Burke et al.
6,693,834 B1 * 2/2004 Wu ...................... H10B 12/485
365/201

(Continued)

FOREIGN PATENT DOCUMENTS

KR 10-1683548 B1 12/2016
KR 20210054753 A 5/2021
KR 20220050305 A 4/2022

*Primary Examiner* — Younes Boulghassoul
(74) *Attorney, Agent, or Firm* — Muir Patent Law, PLLC

(57) ABSTRACT

A semiconductor device includes a substrate having a key region, a dummy active pattern on the key region, the dummy active pattern including a first impurity region and a second impurity region, a line structure provided on the first impurity region and extended in a first direction, a dummy gate electrode provided between the first and second impurity regions and extended in a second direction crossing the first direction, and a dummy contact disposed adjacent to a side of the line structure and connected to the second impurity region. The dummy contact includes a plurality of long contacts arranged in the second direction.

20 Claims, 21 Drawing Sheets

(51) Int. Cl.

| | |
|---|---|
| *H10B 12/00* | (2023.01) |
| *H10D 30/62* | (2025.01) |
| *H10D 64/01* | (2025.01) |
| *H10D 84/01* | (2025.01) |
| *H10D 84/03* | (2025.01) |
| *H10D 84/85* | (2025.01) |
| *H10D 89/10* | (2025.01) |

(52) U.S. Cl.

CPC ....... *H10D 30/6211* (2025.01); *H10D 64/017* (2025.01); *H10D 84/0135* (2025.01); *H10D 84/0149* (2025.01); *H10D 84/038* (2025.01); *H10D 89/10* (2025.01)

(56) References Cited

U.S. PATENT DOCUMENTS

| | | | |
|---|---|---|---|
| 8,513,821 B2 * | 8/2013 | Yao | G03F 7/70683 |
| | | | 257/E23.179 |
| 9,214,317 B2 | 12/2015 | Shur | |
| 9,347,862 B2 | 5/2016 | Lynch | |
| 10,651,129 B1 * | 5/2020 | Hironaka | G03F 7/70683 |
| 10,677,742 B2 | 6/2020 | Gawhane | |
| 10,768,533 B2 | 9/2020 | Xiao et al. | |
| 11,231,376 B2 | 1/2022 | Chen et al. | |
| 2018/0113387 A1 * | 4/2018 | Xiao | G03F 7/70466 |
| 2018/0226303 A1 * | 8/2018 | Won | H01L 22/12 |
| 2021/0199715 A1 | 7/2021 | Goh et al. | |
| 2022/0115383 A1 * | 4/2022 | Yoon | H10B 12/315 |

* cited by examiner

FIG. 12

SEMICONDUCTOR DEVICE HAVING OVERLAY STRUCTURES IN A KEY REGION

CROSS-REFERENCE TO RELATED APPLICATIONS

This U.S. non-provisional patent application claims priority under 35 U.S.C. § 119 to Korean Patent Application No. 10-2022-0066323, filed on May 30, 2022, in the Korean Intellectual Property Office, the entire contents of which are hereby incorporated by reference.

BACKGROUND

1. Field

The present disclosure relates to an overlay measuring method and a semiconductor device including an overlay key structure.

2. Description of the Related Art

Due to their small-size, multifunctionality, and/or low-cost characteristics, semiconductor devices are being esteemed as important elements in the electronics industry. The semiconductor devices are classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, structural complexity and/or integration density of semiconductor devices are being increased.

As an integration density of a semiconductor device increases, a density of patterns formed on a unit area of a substrate increases. In addition, as a semiconductor device with multiple functions and high performance is required, the number of layers formed on the substrate increases. Accordingly, a fabrication process of the semiconductor device should be performed to accurately form patterns at desired positions. An alignment key or an overlay key is used to realize an accurate alignment between layers stacked on a substrate.

An overlay measuring process is performed to examine an extent of misalignment between a lower pattern and an upper pattern, which are stacked on a substrate. The overlay measuring process is performed to obtain overlay measurement values from several positions of the substrate. In this case, the overlay measurement values may depend on the measurement positions.

SUMMARY

According to an embodiment, a semiconductor device may include a substrate including a key region, a dummy active pattern on the key region, the dummy active pattern including a first impurity region and a second impurity region, a line structure provided on the first impurity region and extended in a first direction, a dummy gate electrode provided between the first and second impurity regions and extended in a second direction crossing the first direction, and a dummy contact disposed adjacent to a side of the line structure and connected to the second impurity region. The dummy contact may include a plurality of long contacts arranged in the second direction.

According to an embodiment, a semiconductor device may include a substrate including a key region, lower conductive patterns on the key region, and upper conductive patterns adjacent to the lower conductive patterns. The upper conductive patterns may include first programmed conductive patterns, which are arranged in a first direction and constitute a first mark structure extending in the first direction. The upper conductive patterns may include second programmed conductive patterns, which are arranged in a second direction and constitute a second mark structure extending in the second direction. The first and second mark structures may be provided to cross each other, and each of the first and second mark structures may have a voltage contrast (VC) signal that is displayed to be bright or dark always when an e-beam inspection is performed thereon.

According to an embodiment, a semiconductor device may include a substrate including a key region, lower conductive patterns on the key region, and upper conductive patterns adjacent to the lower conductive patterns. The upper conductive patterns may include a dummy conductive pattern, which are electrically connected to or disconnected from a corresponding one of the lower conductive patterns, and a first programmed conductive pattern, which is electrically connected to a corresponding one of the lower conductive patterns. The first programmed conductive pattern may include a plurality of first programmed conductive patterns, which are arranged along a first direction, and the first programmed conductive patterns may constitute a first mark structure extending in the first direction.

According to an embodiment, an overlay measuring method may include placing a lower pattern and an upper pattern in a layout, shifting at least one of the lower and upper patterns by a programmed misalignment, adding a programmed mark in the layout, forming a lower conductive pattern, an upper conductive pattern, and a mark structure on a key region of a substrate, based on the layout, the mark structure being formed by the programmed mark, performing an e-beam inspection on the key region to obtain a voltage contrast (VC) image, the VC image including a reference mark that is a signal of the mark structure, matching an actual measuring region of the VC image to the layout using the reference mark, and obtaining an overlay value in the key region.

BRIEF DESCRIPTION OF THE DRAWINGS

Features will become apparent to those of skill in the art by describing in detail exemplary embodiments with reference to the attached drawings, in which:

FIGS. 6 to 14 are diagrams illustrating stages in the overlay measuring method of FIG. 4.

DETAILED DESCRIPTION

Figure 1:
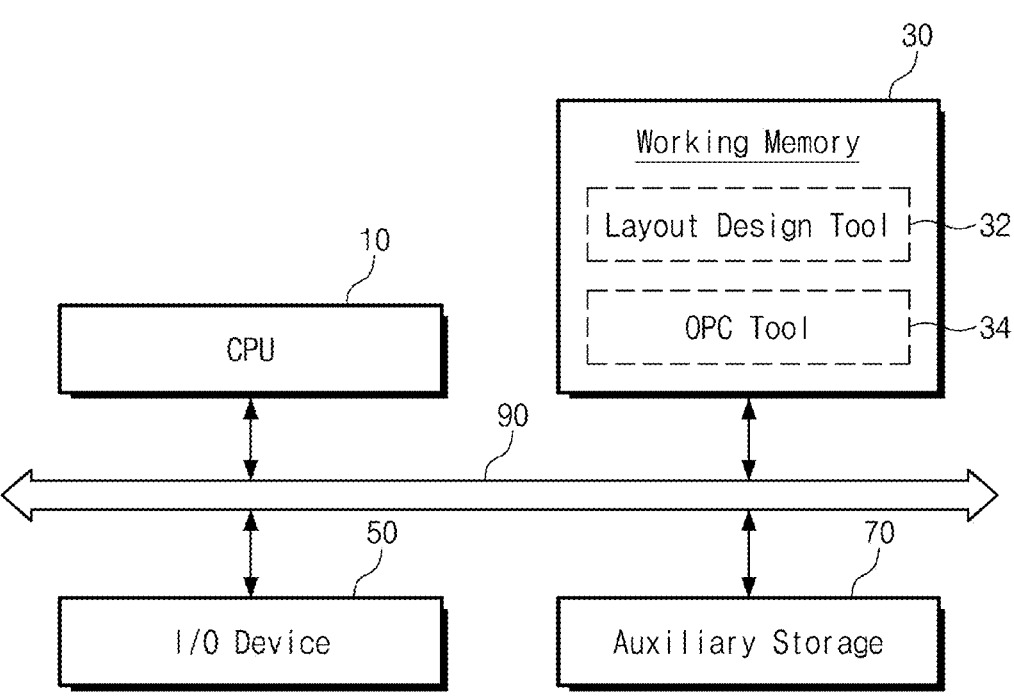
FIG. 1 is a block diagram illustrating a computer system for performing a semiconductor design process, according to an embodiment.

FIG. 1 is a block diagram illustrating a computer system for performing a semiconductor design process, according to an embodiment. Referring to FIG. 1, a computer system may include a central processing unit (CPU) 10, a working memory 30, an input-output (I/O) unit 50, and an auxiliary storage 70. In an embodiment, the computer system may be provided as a system which is customized to execute a layout design process according to embodiment. Furthermore, the computer system may be configured to carry out various design and check simulation programs.

The CPU 10 may be configured to run a variety of software programs (e.g., application programs, operating systems, and device drivers) which are executed on the computer system. The CPU 10 may be configured to run an operating system (OS) loaded on the working memory 30. Furthermore, the CPU 10 may run various application programs, which are executed based on the operating system. For example, the CPU 10 may be configured to run a layout design tool 32 and/or an open platform communications (OPC) tool 34 loaded on the working memory 30.

The operating system or application programs may be loaded on the working memory 30. For example, when the computer system starts a booting operation, an image of the operating system stored in the auxiliary storage 70 may be loaded on the working memory 30 according to a booting sequence. Overall input/output operations of the computer system may be managed by the operating system (OS). An application program, which is chosen by a user or is provided for basic services, may be loaded on the working memory 30. For example, the layout design tool 32 and/or the OPC tool 34 may be loaded on the working memory 30 from the auxiliary storage 70.

The layout design tool 32 may provide a biasing function capable of changing specific layout patterns to have shapes and positions that are different from those defined by a design rule. The layout design tool 32 may be configured to perform a design rule check (DRC) under the changed condition for the bias data. The OPC tool 34 may be configured to perform an optical proximity correction (OPC) process on layout data, which is output from the layout design tool 32. The working memory 30 may be one of volatile memory devices (e.g., static random access memory (SRAM) or dynamic random access memory (DRAM) devices) or nonvolatile memory devices (e.g., phase change random access memory (PRAM), magnetoresistive random access memory (MRAM), resistive random access memory (ReRAM), ferroelectric random access memory (FRAM), and NOR FLASH memory devices).

The input-output unit 50 may be configured to control user's data to be input and output through a user interface device. For example, the input-output unit 50 may include a keyboard or a monitor which is used to receive relevant information from a designer. By using the input-output unit 50, it may be possible for the designer to receive information on semiconductor regions or data paths requiring adjusted operating characteristics. The input-output unit 50 may be configured to display a progressive status or result of a process that is executed by the OPC tool 34.

The auxiliary storage 70 may be provided as a storage medium of the computer system. The auxiliary storage 70 may be used to store the application programs, the image of the operating system, and various kinds of data. The auxiliary storage 70 may be or include one of memory cards (e.g., MMC, eMMC, SD, MicroSD, and so forth), a hard disk drive (HDD), or a solid state drive (SSD). The auxiliary storage 70 may include a NAND FLASH memory device with a large memory capacity. In an embodiment, the auxiliary storage 70 may include next-generation non-volatile memory devices (e.g., PRAM, MRAM, ReRAM, and FRAM devices) or a NOR FLASH memory device.

A system interconnector 90 may be further provided as a system bus for an internal network of the computer system. The CPU 10, the working memory 30, the input-output unit 50, and the auxiliary storage 70 may be electrically connected to each other through the system interconnector 90 to exchange data between them. However, the structure of the system interconnector 90 may not be limited to this example, e.g., an additional data-exchanging element may be further provided to improve the efficiency in a data processing process.

Figure 2:
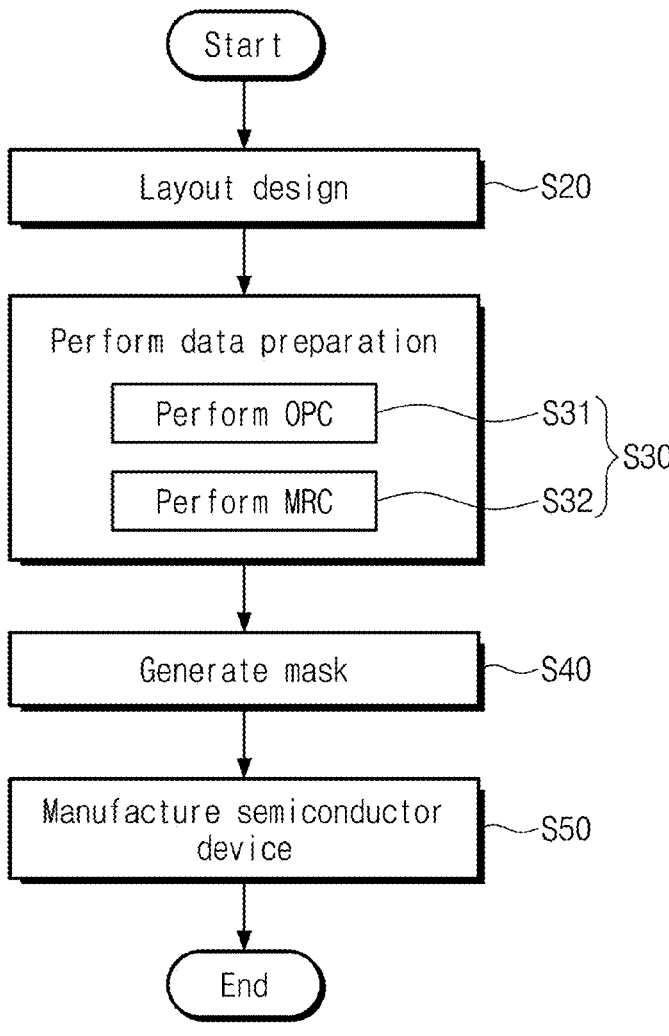
FIG. 2 is a flow chart illustrating a method of designing and fabricating a semiconductor device, according to an embodiment.

FIG. 2 is a flow chart illustrating a method of designing and fabricating a semiconductor device, according to an embodiment.

Referring to FIG. 2, a layout designing step using the computer system of FIG. 1 may be performed to realize a semiconductor integrated circuit on a silicon substrate (in S20). For example, the layout designing step may be performed based on a designed integrated circuit. The layout designing step may be a step of defining shapes or sizes of patterns constituting transistors and metal lines, e.g., designing the arrangement, shapes, and sizes of patterns via a computer simulation, which will be actually formed on the silicon substrate.

After the layout designing step, a verification step may be performed on the layout to check whether there is a portion violating the given design rule. In an embodiment, the verification step may include evaluating verification items, e.g., a design rule check (DRC) and an electrical rule check (ERC). Here, evaluating the DRC item may be performed to evaluate whether the layout meets the given design rule, and evaluating the ERC item may be performed to evaluate whether there is an issue of electrical disconnection in the layout.

A data preparation (DP) step may be performed to obtain mask data from a designed layout (in S30). The data preparation step may include performing an optical proximity correction (OPC) step on the designed layout (in S31) and performing a mask rule check (MRC) step (in S32) on the result of the OPC step.

Layout patterns, which are prepared by the layout design step, may be realized on a silicon wafer through a photolithography process. The OPC step may be performed to correct an optical proximity effect or a distortion effect, which may occur in the photolithography process. In the OPC step, the layout may be modified to reduce a difference in shape between designed patterns and actually-formed patterns, which may be caused by the refraction or process effects in an exposure step. As a result of the OPC step, the shapes and positions of patterns in the designed layout may be changed or biased.

The MRC step (in S32) may be performed to check whether the patterns, which are changed through the OPC step, meet a mask rule. A pattern violating the mask rule may be adjusted to obtain a clean-up result, from which all errors violating the mask rule are removed. The clean-up result may be mask data that are obtained as a result of the data preparation step S30.

According to an embodiment, the MRC step may be performed in consideration of an overlay value in an after-etching inspection (hereinafter, AEI) step (e.g., in S217 in FIG. 4). Accordingly, it may be possible to obtain mask data, from which a misalignment between patterns to be actually formed on the silicon substrate is corrected. A method of obtaining the AEI overlay value will be described with reference to FIGS. 4 to 14.

A photomask may be manufactured, based on the mask data obtained through the data preparation step (in S40). In general, the photomask may be manufactured by patterning a chromium layer, which is formed on a glass substrate, to depict the layout pattern.

The manufactured photomask may be used to manufacture a semiconductor device (in S50). In the actual fabricating process using the photomask, the exposing and etching steps may be repeatedly performed, and thus, patterns defined in the layout design step may be sequentially formed on a silicon substrate.

Figure 3:
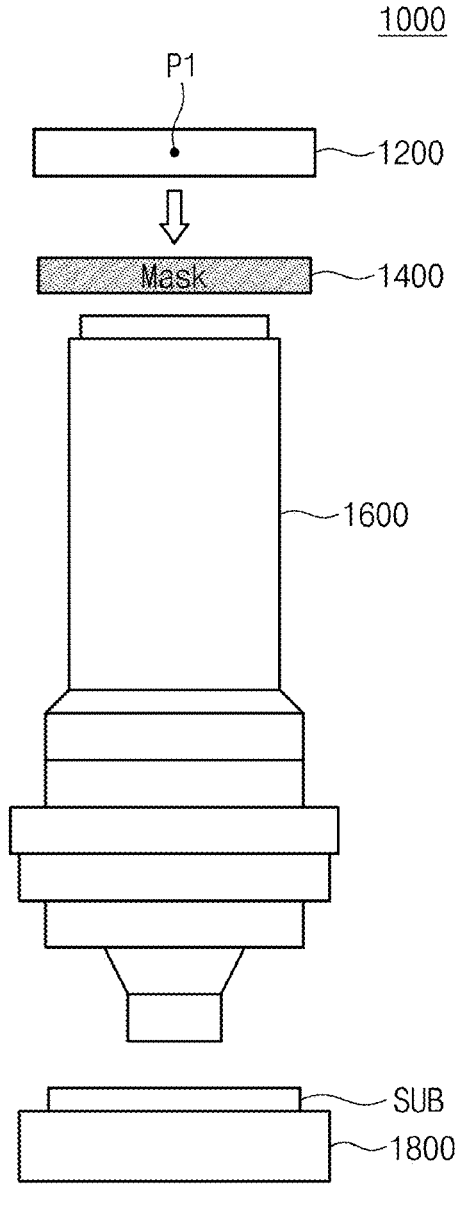
FIG. 3 is a conceptual diagram illustrating a photolithography system using a photomask according to an embodiment.

FIG. 3 is a conceptual diagram illustrating a photolithography system using a photomask according to an embodiment. A photolithography system 1000 may include a light source 1200, a photomask 1400, a reduction projection apparatus 1600, and a substrate stage 1800. Although not illustrated in FIG. 3, some elements may be additionally provided in the photolithography system 1000. For example, the photolithography system 1000 may further include a sensor, which is used to measure a height and a slope of a top surface of a substrate SUB.

The light source 1200 may be configured to emit light. The light emitted from the light source 1200 may be incident into the photomask 1400. To control a focal length, a lens may be provided between the light source 1200 and the photomask 1400. The light source 1200 may be configured to emit an ultraviolet light. For example, the light source 1200 may be a KrF light source (at 234 nm), an ArF light source (at 193 nm), or an extreme ultraviolet (EUV) light source. The light source 1200 may include a single point light source P1. In other embodiments, the light source 1200 may be configured to have a plurality of point light sources.

The photomask 1400 may include image patterns, which are used to transcribe or print the designed layout onto the substrate SUB. The image patterns may be formed, based on mask data obtained through the data preparation step described above. The image patterns may be defined by transparent and opaque regions. The transparent region may be formed by etching a metal layer (e.g., a chromium layer) that is provided on the photomask 1400. The transparent region may be transparent to light, which is emitted from the light source 1200. By contrast, the opaque region may be configured to prevent or block the light.

The light passing through the transparent region of the photomask 1400 may be incident into a photoresist layer, which is formed on the substrate SUB, through the reduction projection apparatus 1600, and as a result, photoresist patterns may be formed on the substrate SUB. That is, the light may be incident into the substrate SUB through the reduction projection apparatus 1600, and in this case, the photoresist patterns, which are formed on the substrate SUB using the reduction projection apparatus 1600, may have shapes corresponding to the image patterns of the photomask 1400. In sum, by using the reduction projection apparatus 1600, it may be possible to form the photoresist patterns, whose shapes are defined by the image patterns of the photomask 1400, on the substrate SUB.

The substrate stage 1800 may be configured to support the substrate SUB. The substrate SUB may include, e.g., a silicon wafer. The reduction projection apparatus 1600 may include an aperture. The aperture may be used to increase a focal depth of the ultraviolet light emitted from the light source 1200. As an example, the aperture may include a dipole or quadruple aperture. The reduction projection apparatus 1600 may further include a lens for controlling a focal length.

As an integration density of a semiconductor device increases, a distance between the image patterns of the photomask 1400 may decrease, e.g., have a very small value. In this case, due to a proximity issue, the patterns formed on the substrate SUB may have distorted shapes (i.e., different from those of the image patterns of the photomask 1400). The distortion of the patterns may lead to malfunction of an electronic device or circuit to be formed on the substrate SUB.

A resolution enhancement technology may be used to prevent the distortion of the patterns. An optical proximity correction (OPC) technology, which is used in step S31 of FIG. 2, may be an example of the resolution enhancement technology. According to the OPC technology, the optical distortion issue, which is caused by interference and diffraction, may be predicted by a simulation process using an OPC model. The designed layout may be corrected or biased, based on the predicted result. Based on the corrected layout, image patterns may be formed on the photomask 1400, and in this case, the patterns may be formed in desired shapes on the substrate SUB.

A layout of a semiconductor device may include a plurality of layers. In an embodiment, the OPC step may be performed to correct a layout for each of the layers. That is, the OPC step may be independently performed on each of the layers. A semiconductor device may be fabricated by sequentially realizing a plurality of layers on a substrate through a semiconductor process. As an example, the semiconductor device may include a plurality of metal layers, which are stacked to realize a specific circuit.

Figure 4:
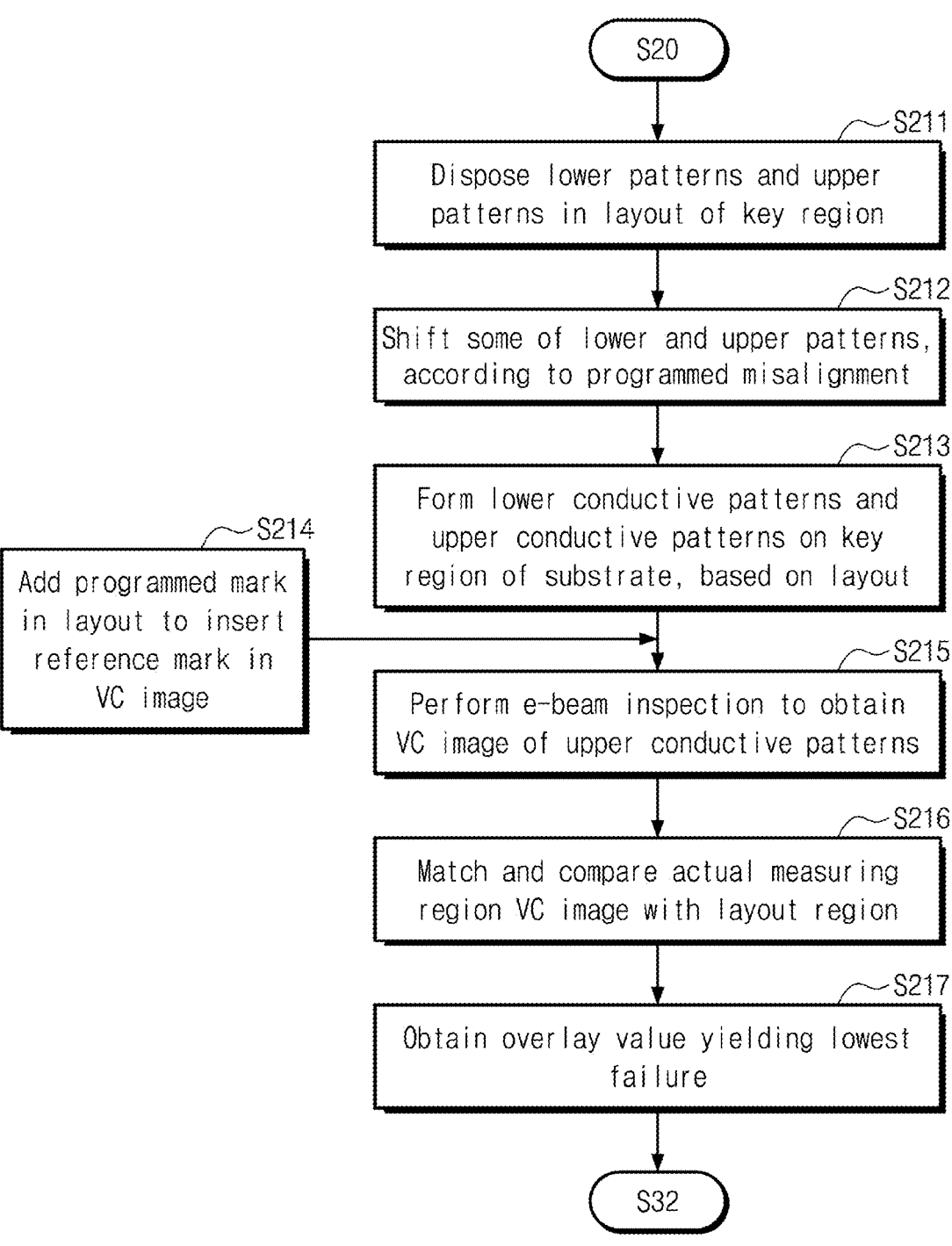
FIG. 4 is a flow chart illustrating detailed steps in an overlay measuring method, according to an embodiment.
Figure 5:
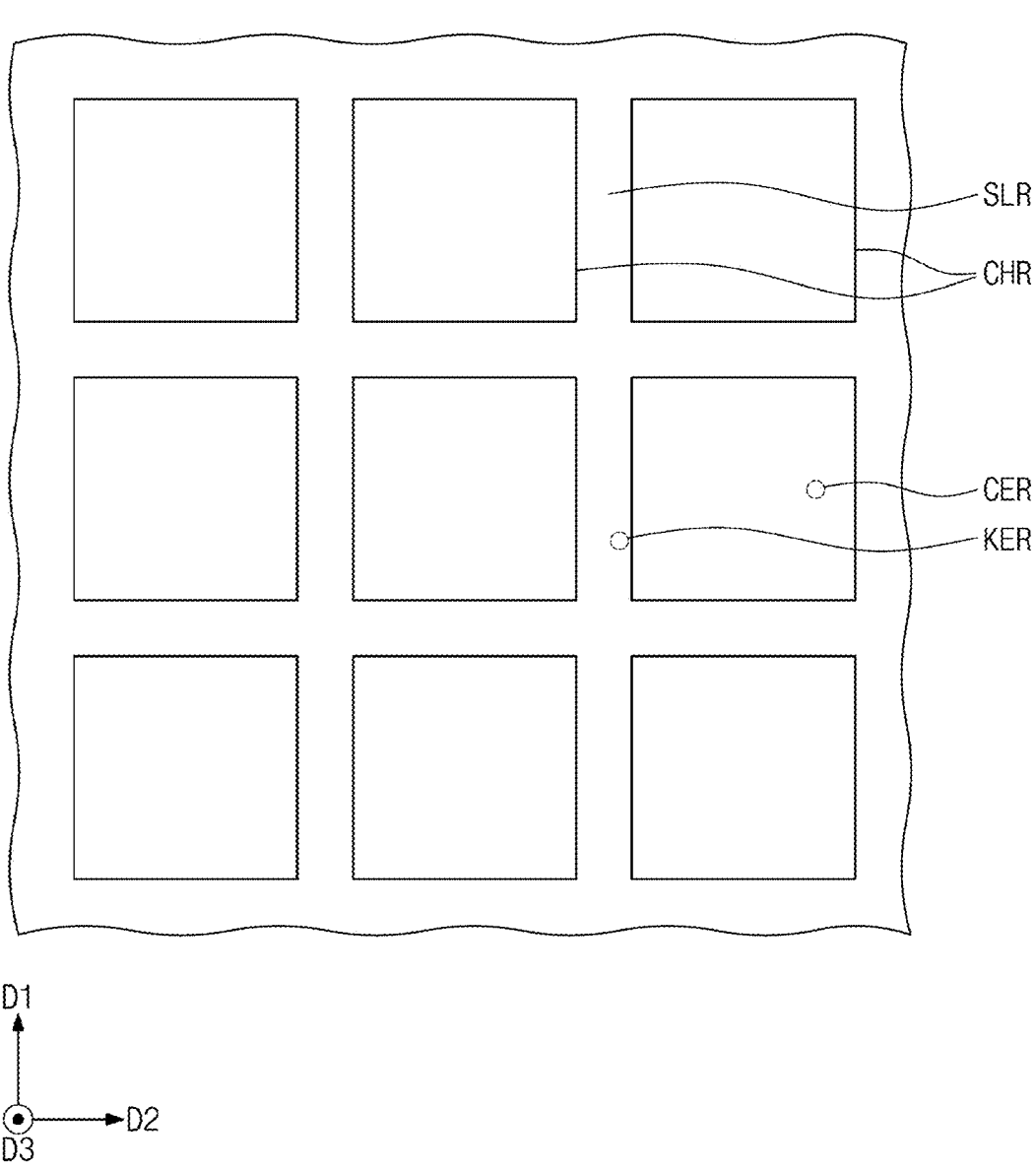
FIG. 5 is a plan view schematically illustrating a substrate, on which a semiconductor device according to an embodiment will be formed.

FIG. 4 is a flow chart illustrating detailed steps in an overlay measuring method, according to an embodiment. FIG. 5 is a plan view schematically illustrating a portion of the substrate SUB (e.g., a wafer), on which a semiconductor device according to an embodiment is to be formed. FIGS. 6 to 14 are diagrams illustrating stages in the overlay measuring method of FIG. 4.

Referring to FIG. 5, the substrate SUB may include a plurality of chip regions CHR, which are two-dimensionally arranged, and a scribe line region SLR, which is provided between the chip regions CHR. After a semiconductor fabrication process, the scribe line region SLR may be cut to divide the chip regions CHR into respective dies (i.e., semiconductor chips). The chip region CHR may include a memory cell region CER, in which memory cells are disposed. The scribe line region SLR may include a key region KER, in which an alignment key and an overlay key are disposed. In the key region KER according to the present embodiment, an overlay key structure may be provided to measure an overlay between a lower layer and an upper layer.

Figure 6:
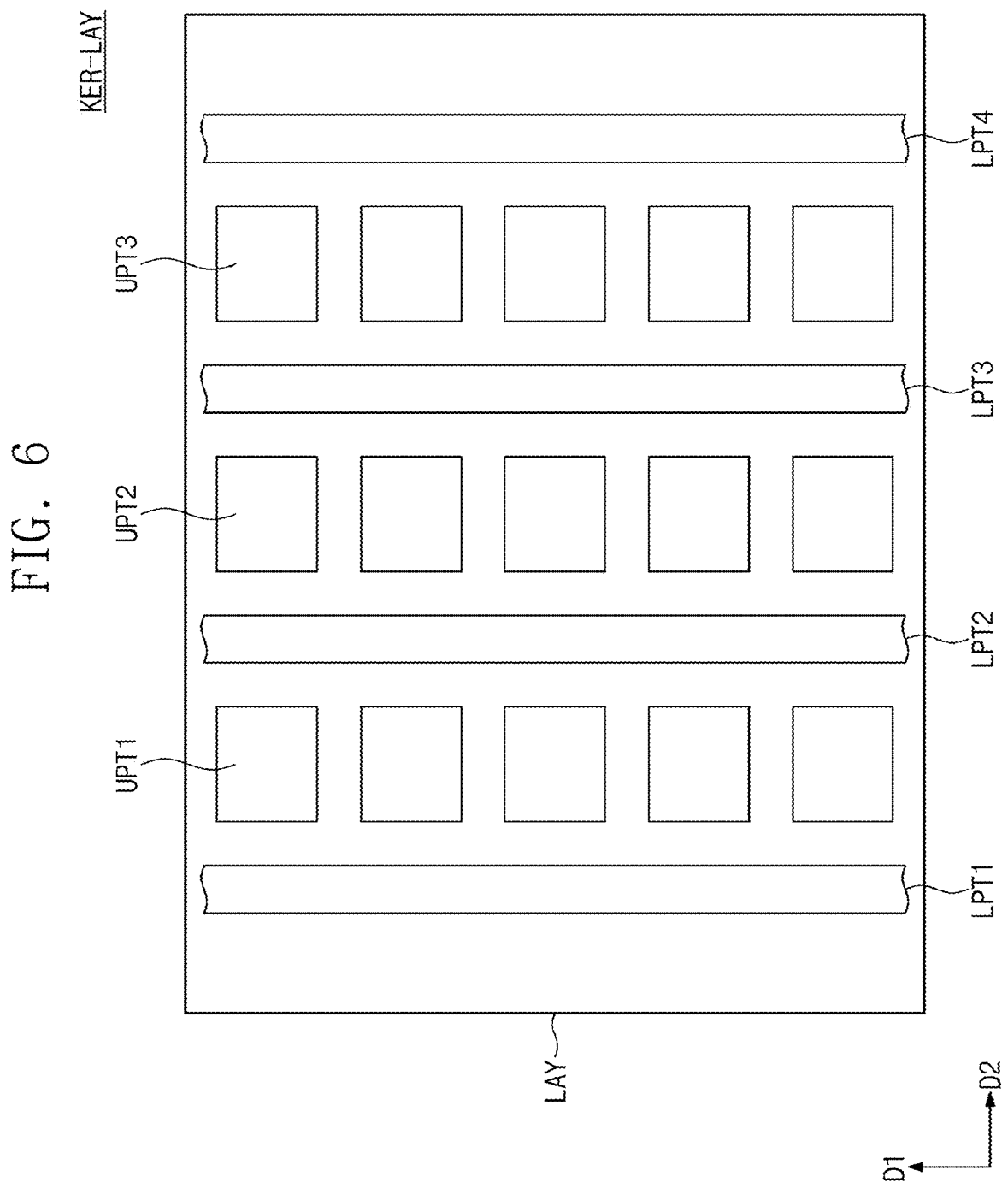

Referring to FIGS. 4 and 6, a layout LAY of the key region KER may be designed, e.g., the shapes, sizes, and relative arrangement of patterns may be preliminary planned and outlined via a computer simulation. For example, lower patterns LPT1-LPT4 and upper patterns UPT1-UPT3 may be disposed, e.g., via a simulation, in the layout LAY of the key region KER (in S211).

For example, the lower patterns LPT1-LPT4 may include first to fourth lower patterns LPT1-LPT4, which are arranged, e.g., spaced apart from each other, in a second direction D2. The first to fourth lower patterns LPT1-LPT4 may be extended in a first direction D1 and parallel to each other. The upper patterns UPT1-UPT3 may include first to third upper patterns UPT1-UPT3. The first upper patterns UPT1 may be disposed between the first and second lower patterns LPT1 and LPT2. The first upper patterns UPT1 may be arranged, e.g., spaced apart from each other, in the first direction D1. The second upper patterns UPT2 may be disposed between the second and third lower patterns LPT2 and LPT3. The second upper patterns UPT2 may be arranged, e.g., spaced apart from each other, in the first direction D1. The third upper patterns UPT3 may be disposed between the third and fourth lower patterns LPT3 and LPT4. The third upper patterns UPT3 may be arranged, e.g., spaced apart from each other, in the first direction D1.

Figure 7:
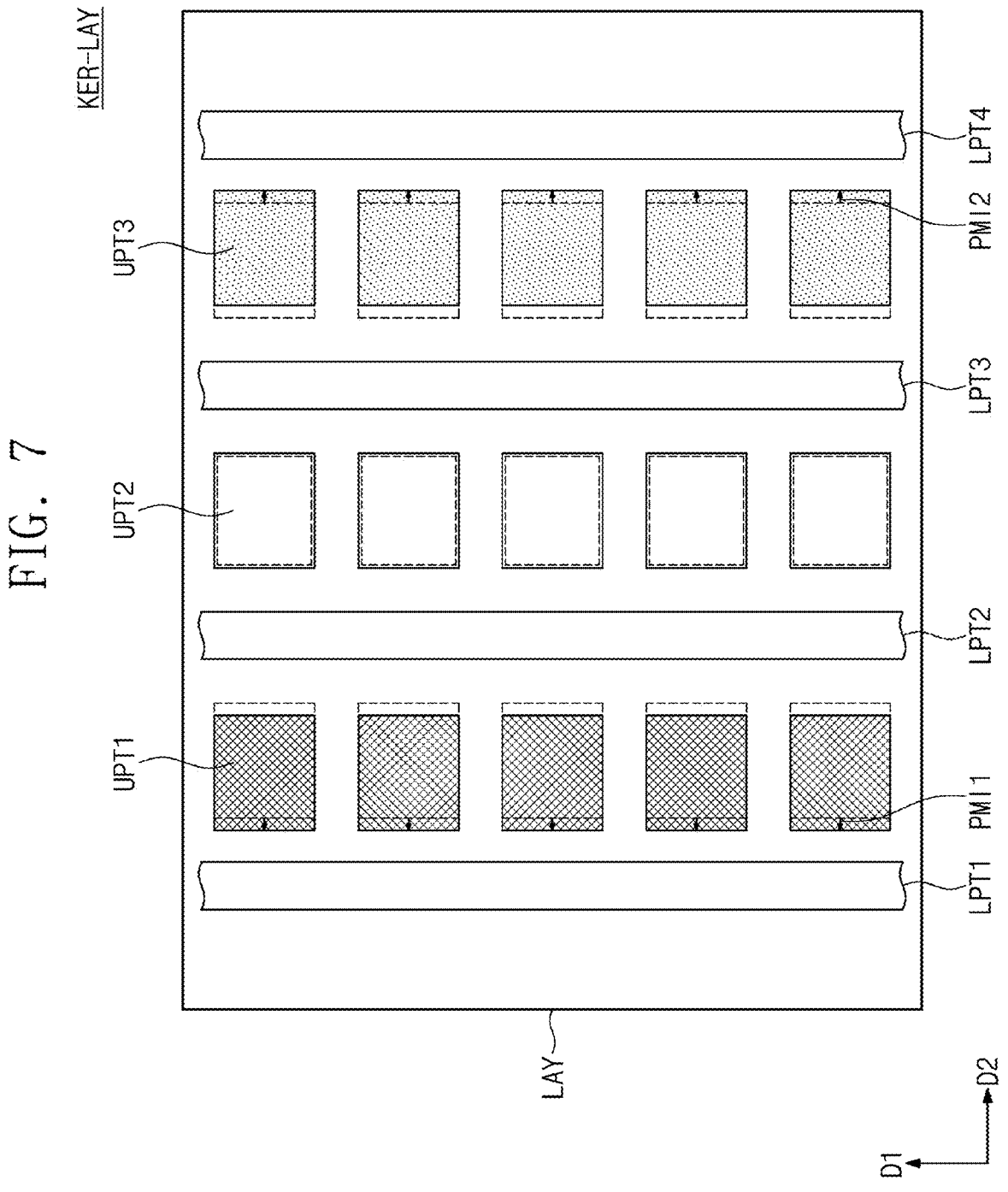

Referring to FIGS. 4 and 7, some of the lower and upper patterns may be shifted according to a programmed misalignment (in S212), e.g., positioning of some of the patterns may be shifted within the layout via a computer simulation. For example, the first upper patterns UPT1 may be shifted in an opposite direction of the second direction D2 by a first programmed misalignment PMI1. The third upper patterns UPT3 may be shifted in the second direction D2 by a second programmed misalignment PMI2. Meanwhile, the second upper patterns UPT2 may not be shifted. That is, the programmed misalignment value for the second upper patterns UPT2 may be zero.

Due to the result of the programmed misalignment step, the first upper patterns UPT1 may be placed at positions that are closer to the first lower pattern LPT1 than to the second lower pattern LPT2. Due to the result of the programmed misalignment step, the third upper patterns UPT3 may be placed at positions that are closer to the fourth lower pattern LPT4 than to the third lower pattern LPT3.

Figure 8:
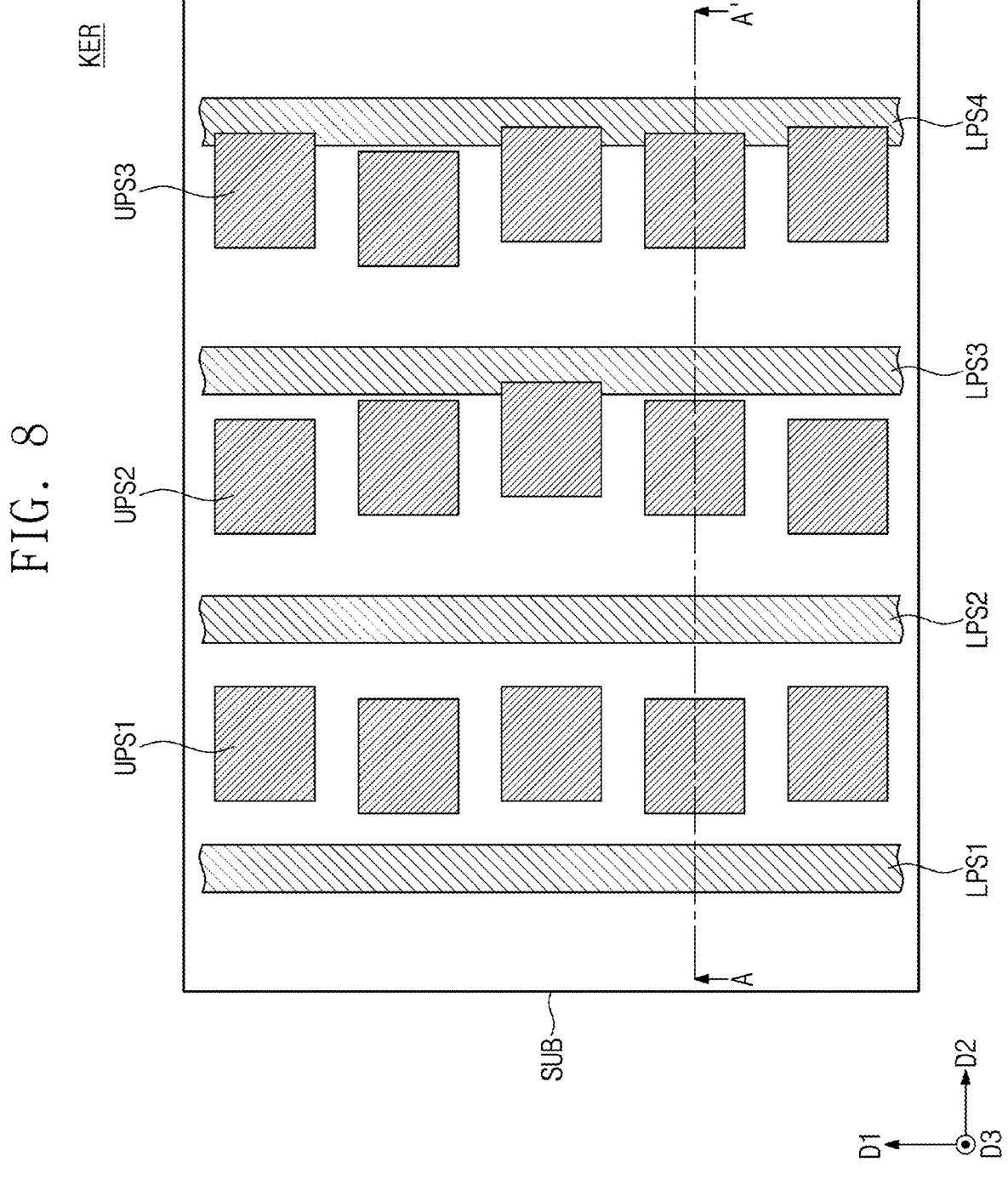
Figure 9:
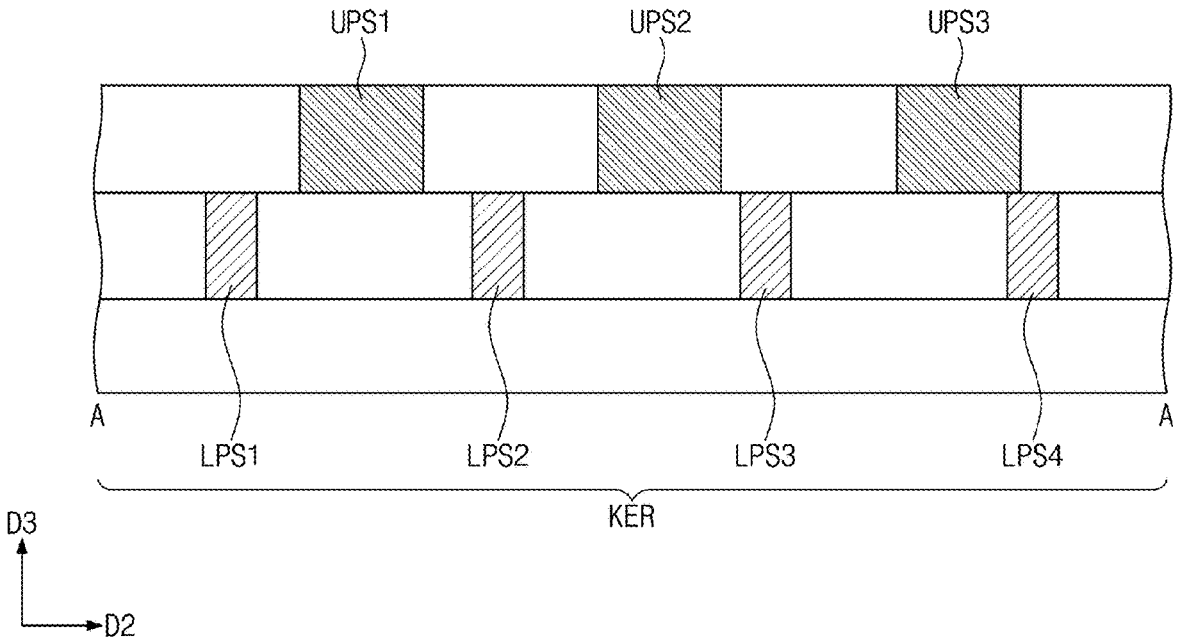

FIG. 8 is a plan view illustrating the key region KER of the substrate SUB, according to an embodiment. FIG. 9 is a sectional view taken along a line A-A' of FIG. 8.

Referring to FIGS. 4, 8, and 9, lower conductive patterns LPS1-LPS4 and upper conductive patterns UPS1-UPS3 may be formed on the key region KER of the substrate SUB, based on the layout LAY described with reference to FIG. 7 (in S213). The lower conductive patterns LPS1-LPS4 and the upper conductive patterns UPS1-UPS3 may be formed of or include at least one of doped semiconductor materials, conductive metal nitride materials, and/or metallic materials.

In detail, a photomask may be manufactured based on the layout LAY of FIG. 7 (in S40 of FIG. 2), e.g., a physical photomask may be manufactured in accordance with the layout LAY generated by the computer simulation in FIG. 7. The photolithography process of FIG. 3 using the manufactured photomask may be performed to sequentially form the lower conductive patterns LPS1-LPS4 and the upper conductive patterns UPS1-UPS3 on the substrate SUB, e.g., to physically form the lower conductive patterns LPS1-LPS4 and the upper conductive patterns UPS1-UPS3 on the substrate SUB via the manufactured physical mask.

Referring to FIG. 9, the lower conductive patterns LPS1-LPS4 may include the first to fourth lower conductive patterns LPS1-LPS4, which correspond to the first to fourth lower patterns LPT1-LPT4 of FIG. 7, respectively. The upper conductive patterns UPS1-UPS3 may include the first to third upper conductive patterns UPS1-UPS3, which correspond to the first to third upper patterns UPT1-UPT3 of FIG. 7, respectively.

The first to third upper conductive patterns UPS1-UPS3 may be formed at misaligned positions that do not correspond to the first to third upper patterns UPT1-UPT3 of FIG. 7. This is because an overlay value between a lower layer (i.e., the lower conductive patterns LPS1-LPS4) and an upper layer (i.e., the upper conductive patterns UPS1-UPS3) in the key region KER of the substrate SUB is not zero.

Referring back to FIGS. 8 and 9, the first to third upper conductive patterns UPS1-UPS3 on the key region KER of FIG. 8 may be shifted or misaligned with respect to the first to fourth lower conductive patterns LPS1-LPS4 in the second direction D2. Since the third upper patterns UPT3 in the layout LAY are designed to have the second programmed misalignment PMI2 in the second direction D2, the third upper conductive patterns UPS3 may be largely shifted in the second direction D2. Accordingly, four patterns of five third upper conductive patterns UPS3 may be in contact with the fourth lower conductive pattern LPS4. For example, as illustrated in FIG. 9, at least a portion of a bottom surface of the third upper conductive pattern UPS3 may be in direct contact with a top surface of the fourth lower conductive pattern LPS4. The contact between the third upper conductive pattern UPS3 and the fourth lower conductive pattern LPS4 may lead to a failure of the semiconductor device.

Since the second upper patterns UPT2 in the layout LAY are designed to have no misalignment, if an overlay value between the lower and upper layers is zero, the second upper conductive patterns UPS2 should be accurately aligned to be placed between the second and third lower conductive patterns LPS2 and LPS3. However, in the present embodiment, since the upper layer is shifted from the lower layer in the second direction D2, the second upper conductive patterns UPS2 may be formed to be close to the third lower conductive pattern LPS3. Accordingly, at least one of the second upper conductive patterns UPS2 may be in contact with the third lower conductive pattern LPS3.

For example, one of five second upper conductive patterns UPS2 may be in contact with the third lower conductive pattern LPS3. This means that a failure occurs in one second upper conductive pattern UPS2, but not in four second upper conductive patterns UPS2.

The first upper patterns UPT1 in the layout LAY may be designed to have the first programmed misalignment PMI1 in an opposite direction of the second direction D2. In the present embodiment, since the upper layer is shifted in the second direction D2 with respect to the lower layer, the first upper conductive patterns UPS1, which are formed on the key region KER, may be normally aligned to a region between the first and second lower conductive patterns LPS1 and LPS2. For example, all of five first upper conductive patterns UPS1 may be formed to be in non-contact with the first and second lower conductive patterns LPS1 and LPS2. That is, a failure may not occur in the five first upper conductive patterns UPS1. This means that the first programmed misalignment PMI1 may be substantially equal to an overlay value between the lower and upper layers, in the key region KER of FIG. 8.

So far, an example, in which the programmed misalignment is performed on the upper patterns UPT1-UPT3, has been described, for convenience in description. However, embodiments are not limited to this example, e.g., the programmed misalignment process may also be performed on the lower patterns LPT1-LPT4.

Figure 10:
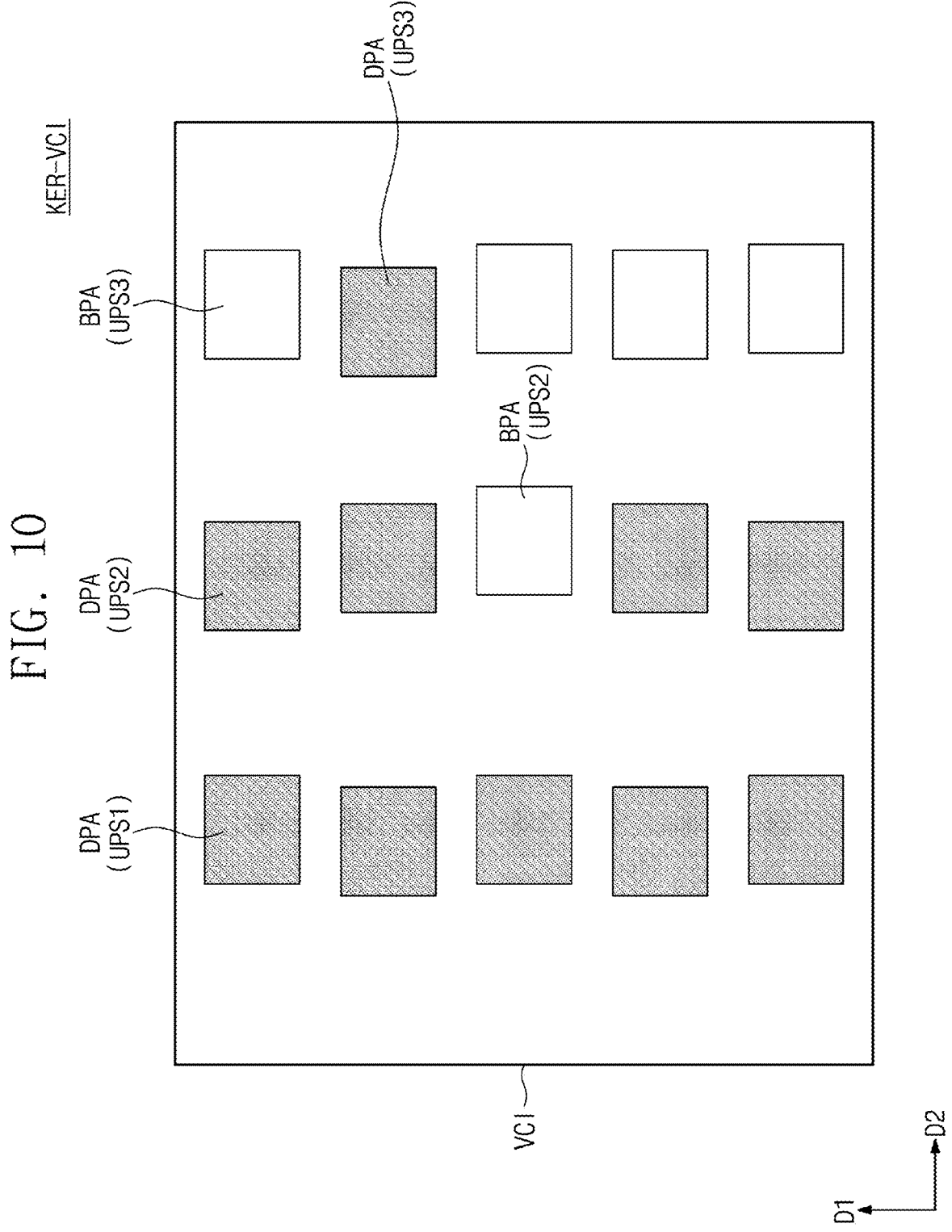

Referring to FIGS. 4 and 10, an e-beam inspection using an electron microscope may be performed on the key region KER of FIG. 8 to obtain a voltage contrast (VC) image VCI of the first to third upper conductive patterns UPS1-UPS3 (in S215). The VC image VCI may include signals (e.g., images) from the first to third upper conductive patterns UPS1-UPS3. The signals from the first to third upper conductive patterns UPS1-UPS3 may be displayed as bright patterns BPA and dark patterns DPA in the VC image VCI.

If one of the first to third upper conductive patterns UPS1-UPS3 is connected to a corresponding one of the lower conductive patterns LPS1-LPS4, it may be displayed as the bright pattern BPA. In other words, the bright pattern BPA may indicate a failed region. If one of the first to third upper conductive patterns UPS1-UPS3 is not connected to the lower conductive patterns LPS1-LPS4, it may be displayed as the dark pattern DPA. In other words, the dark pattern DPA may indicate a failure-free region.

For example, the first upper conductive patterns UPS1 may be displayed as five dark patterns DPA. The second upper conductive patterns UPS2 may be displayed as four dark patterns DPA and one bright pattern BPA. The third upper conductive patterns UPS3 may be displayed as one dark pattern DPA and four bright patterns BPA.

For an actual wafer, since a number of fine patterns, e.g., the upper conductive patterns UPS1-UPS3, are formed on the key region KER, it may be difficult to quickly determine the degree of misalignment between the lower and upper layers using only the electron microscope image. However, in the case where, as shown in FIG. 10, the VC image is used for the inspection process, a failed (i.e., misaligned) region and a normal (i.e., well-aligned) region may be displayed as high contrast regions (e.g., black and white regions), which are produced from signals from the upper conductive patterns UPS1-UPS3, and therefore may be easily distinguished from each other. Furthermore, it may be possible to quickly measure an overlay value between the lower and upper layers.

Figure 11:
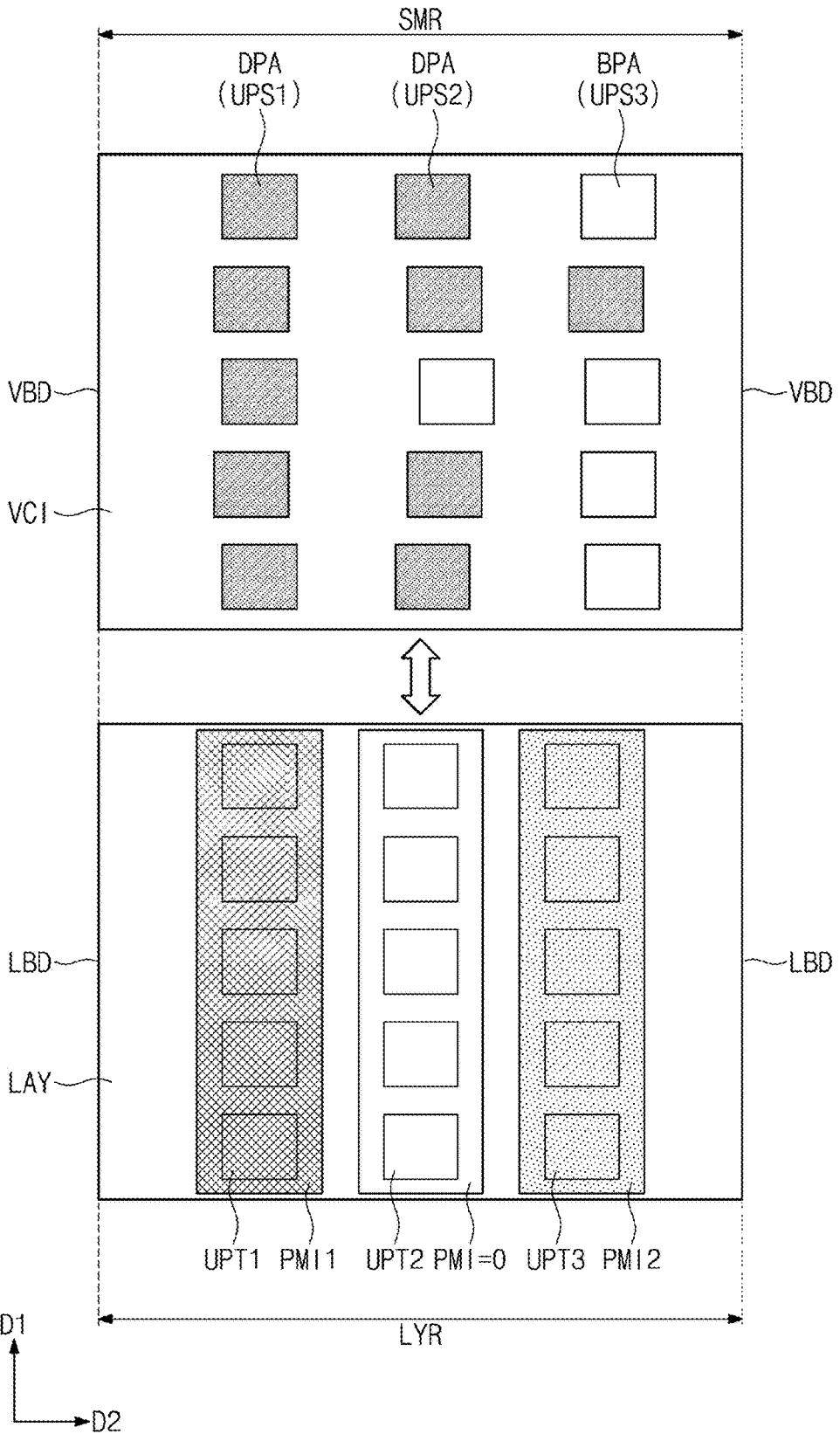

Referring to FIGS. 4 and 11, the VC image VCI from the first to third upper conductive patterns UPS1-UPS3 may be compared with the layout LAY of FIG. 7 (in S216). More specifically, by accurately matching an actual measuring region SMR of the VC image VCI with a layout region LYR, it may be possible to compare the actual measuring region SMR with the layout region LYR.

First, second, and third regions of the layout region LYR, which are respectively applied with the first programmed misalignment PMI1, no programmed misalignment (i.e., PMI=0), and the second programmed misalignment PMI2, may be respectively assigned to the bright and dark patterns BPA and DPA in the actual measuring region SMR. Thus, it may be possible to find that 0, 1, and 4 failures occur in the first, second, and third regions, respectively, of the layout region LYR.

The actual measuring region SMR may be a region that is provided between actual measuring borders VDB of the VC image VCI. The layout region LYR may be a region that is provided between layout borders LBD corresponding to the actual measuring borders VDB.

Figure 14:
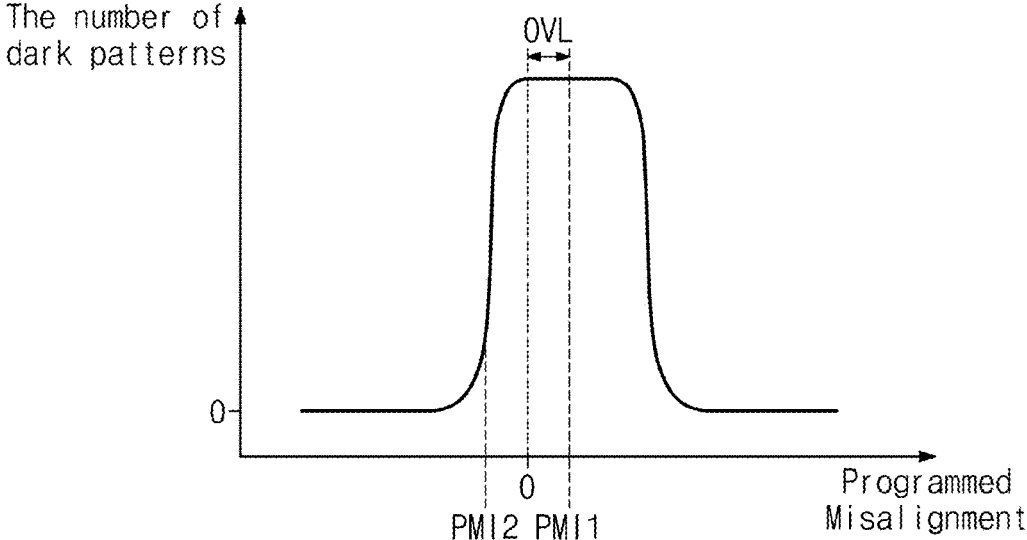

Referring to FIGS. 4 and 14, by measuring the number of the normal regions when the programmed misalignment is applied, it may be possible to obtain a normal distribution curve, as shown in FIG. 14. The number of the normal regions may mean the number of the dark patterns DPA.

For example, according to the VC signal, the number of the dark patterns DPA may be the smallest value (i.e., one) in the region applied with the second programmed misalignment PMI2. The number of the dark patterns DPA may be the largest value (i.e., 5) in the region applied with the first programmed misalignment PMI1. The number of the dark patterns DPA may be four in the region applied with no programmed misalignment (i.e., PMI=0). If the data is plotted, a normal distribution curve may be obtained for the key region KER, as depicted in FIG. 14.

For example, an x value of a point, which is located at the center of the normal distribution curve of FIG. 14, may correspond to the first programmed misalignment PMI1, and the first programmed misalignment PMI1 may be obtained as an overlay value OVL in the corresponding key region KER (in S217). The overlay value OVL, which is obtained through FIG. 14, may be an on-cell overlay value.

Figure 12:
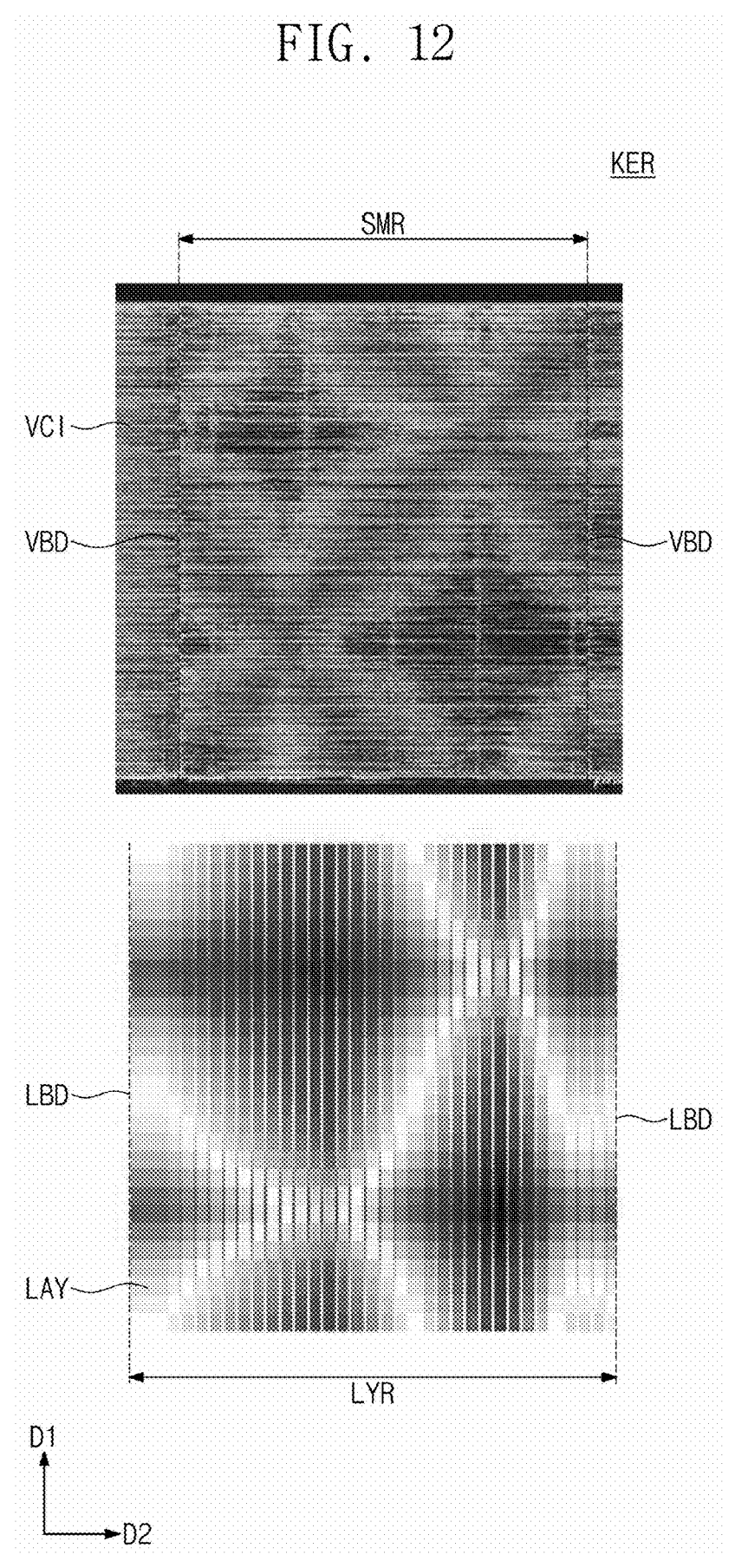

FIG. 12 illustrates the layout LAY of the key region according to an embodiment and the VC image VCI corresponding thereto. For example, FIG. 12 illustrates the layout LAY, which is applied with various (e.g., split) values for the programmed misalignment, and the corresponding VC image VCI. FIG. 12 illustrates an example of the key region KER of an actual semiconductor device that is departed from the simplified example of FIG. 11.

It is very difficult to accurately align the layout region LYR of the layout LAY to the actual measuring region SMR of the actual VC image VCI. This is because, due to a stage inaccuracy issue in a SEM system and a distortion issue in a SEM image, it is difficult to accurately match the VC image VCI with the actual layout LAY.

Figure 13:
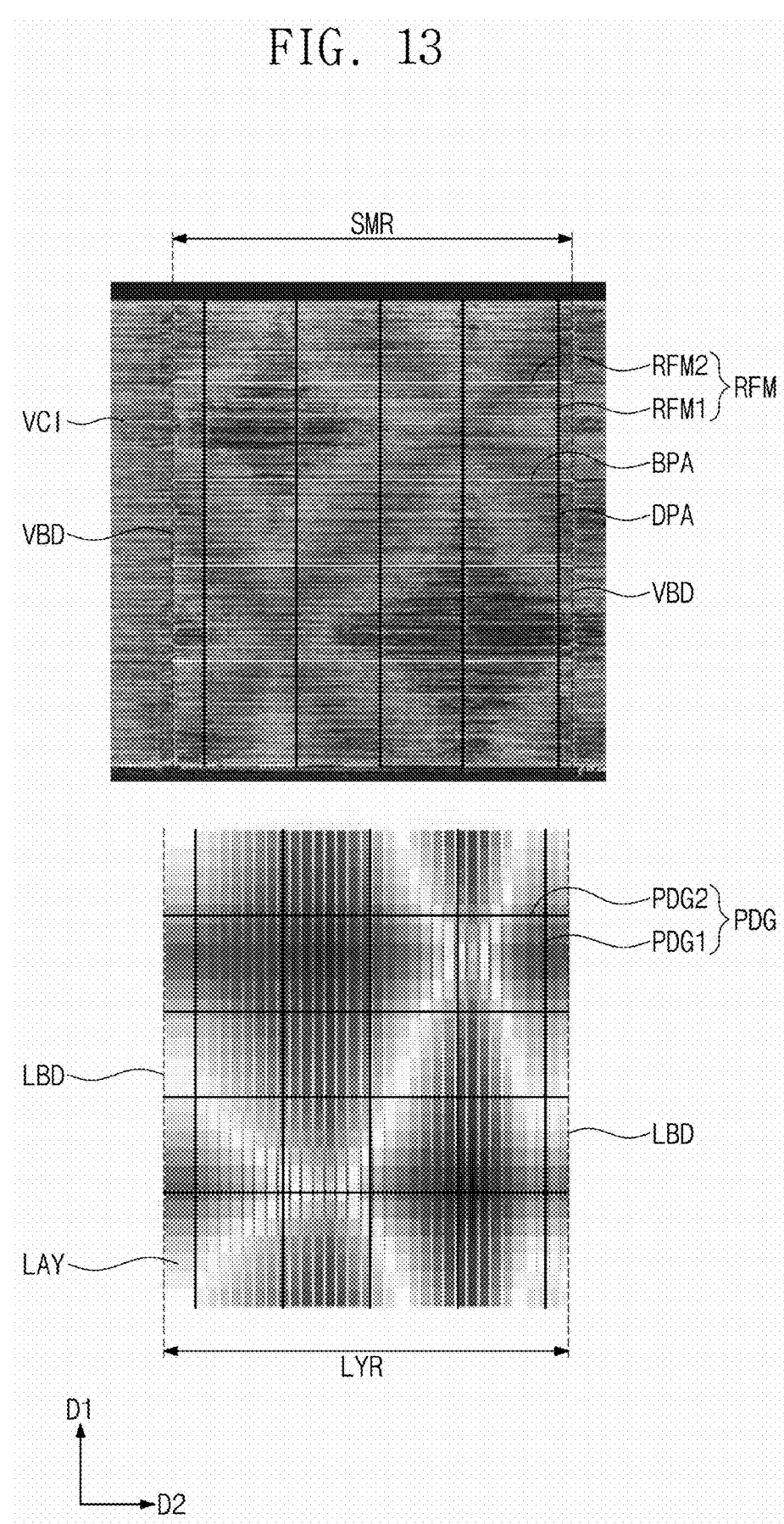

Referring to FIGS. 4 and 13, according to an embodiment, a programmed mark PDG may be added in the layout LAY of the key region KER to accurately match the layout LAY and the VC image VCI with each other (in S214). The programmed mark PDG may include a first programmed mark PDG1, which is extended in the first direction D1, and a second programmed mark PDG2, which is extended in the second direction D2. The first and second programmed marks PDG1 and PDG2 may be provided to cross each other.

A reference mark RFM, which is formed by the programmed mark PDG of the layout LAY, may be inserted in the VC image VCI of the key region KER (in S214). The reference mark RFM may include a first reference mark RFM1 corresponding to the first programmed mark PDG1 and a second reference mark RFM2 corresponding to the second programmed mark PDG2. The first reference mark RFM1 may be extended in the first direction D1, and the second reference mark RFM2 may be extended in the second direction D2 to cross the first reference mark RFM1.

In an embodiment, the first reference mark RFM1 may include the dark patterns DPA, which are arranged in the first direction D1. All image patterns constituting the first reference mark RFM1 may be the dark patterns DPA. The second reference mark RFM2 may include the bright patterns BPA, which are arranged in the second direction D2. All image patterns constituting the second reference mark RFM2 may be the bright patterns BPA.

In another embodiment, the first reference mark RFM1 may be composed of the bright patterns BPA arranged in the first direction D1. The second reference mark RFM2 may be composed of the dark patterns DPA arranged in the second direction D2. Both of the first and second reference marks RFM1 and RFM2 may be composed of the bright patterns BPA or may be composed of the dark patterns DPA.

Due to the presence of the first reference mark RFM1, an absolutely dark line may be provided in the VC image VCI, regardless of an overlay. Due to the presence of the second reference mark RFM2, an absolutely bright line may be provided in the VC image VCI, regardless of the overlay. The reference mark RFM in the VC image VCI may be used as an indicator providing reference coordinates for matching with the layout LAY.

The VC image VCI may be corrected such that the reference mark RFM in the VC image VCI coincides with the programmed mark PDG in the layout LAY exactly. According to an embodiment, the actual measuring borders VDB of the VC image VCI may be adjusted using the reference mark RFM of the VC image VCI such that they coincide with the layout borders LBD of the layout LAY accurately. Thus, the actual measuring region SMR of the VC image VCI may be accurately matched with the layout region LYR of the layout LAY.

Referring back to FIGS. 4 and 14, by matching the actual measuring region SMR of the VC image VCI with the layout region LYR of the layout LAY in FIG. 13, it may be possible to measure the number of the dark patterns in the VC image VCI as a function of the programmed misalignment in the layout LAY. The measured data may be plotted, as illustrated in FIG. 14. In detail, the number of the normal regions (i.e., the dark patterns) or the number of the failed regions (i.e., the bright patterns) may be quickly measured as a function of various programmed misalignment values in the key region KER, from which an overlay is measured, through the VC inspection. Here, by using the reference mark RFM described with reference to FIG. 13, it may be possible to reduce the stage inaccuracy issue in the SEM system and the distortion issue in the SEM image and thereby to obtain highly-reliable results.

The first programmed misalignment PMI1, which is expected to yield the lowest failure based on the result of FIG. 14, may be obtained as the overlay value OVL of the corresponding key region KER. The overlay value OVL, which is obtained from the result of FIG. 14, may be changed depending on a position or region on the wafer of FIG. 5 (i.e., the substrate SUB). In other words, FIG. 4 is an example of the method of obtaining the overlay value OVL in one key region KER. The overlay value OVL for each of the key regions KER in all of the scribe line regions SLR of the wafer (i.e., the substrate SUB) may be obtained by the method of FIG. 4.

Different overlay values for the key regions KER, which are located at different positions in the substrate SUB, may be applied to the mask rule check step (in S32) in the afore-described data preparation step (in S30) of FIG. 2. Accordingly, it may be possible to obtain mask data applied with accurate overlay values, which are obtained in consideration of positions or regions on the wafer. By using a photomask manufactured based on the mask data, it may be possible to fabricate a highly-reliable semiconductor device without a process failure (e.g., in S40 and S50 of FIG. 2).

Figure 15:
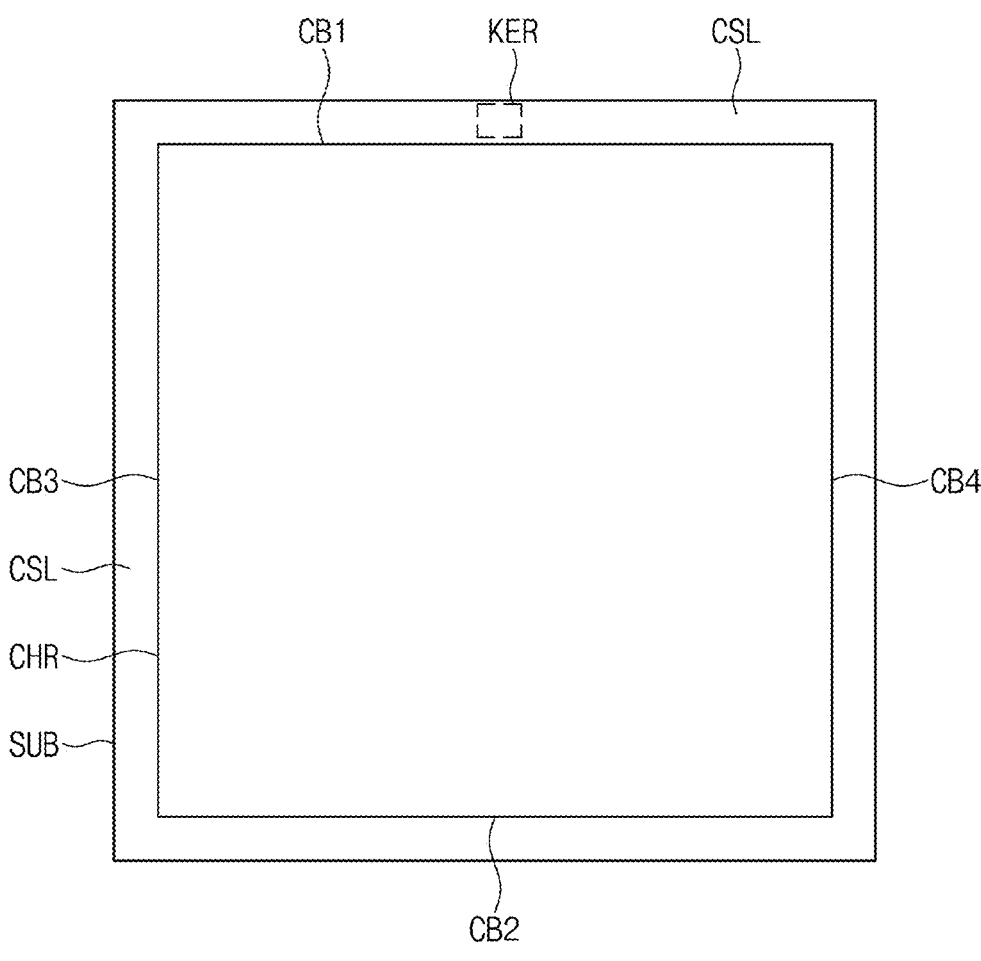
FIG. 15 is a plan view illustrating a semiconductor chip according to an embodiment.
Figure 15:
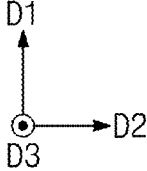
Figure 16:
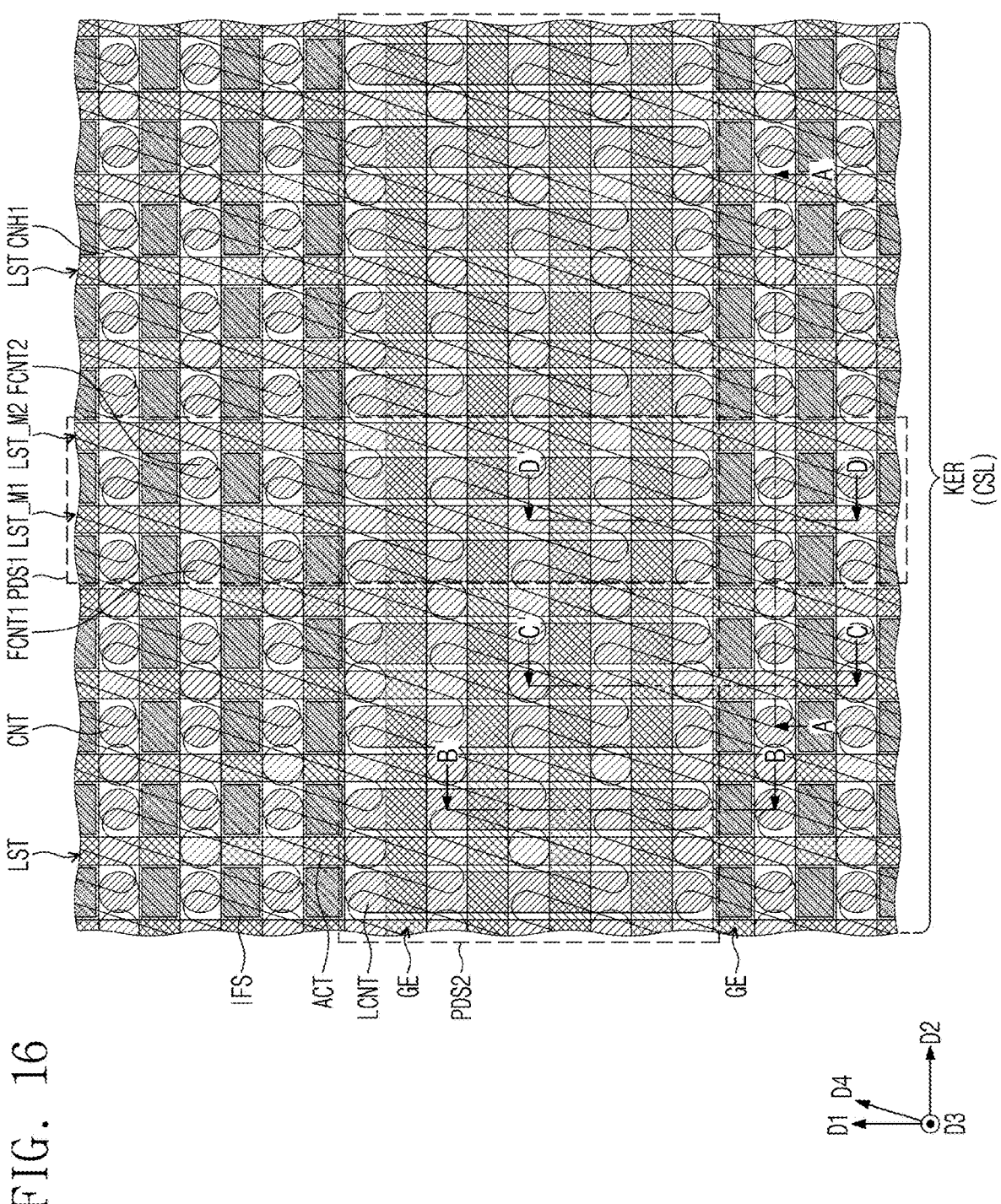
FIG. 16 is a plan view illustrating a semiconductor structure provided in a key region of FIG. 15.

FIG. 15 is a plan view illustrating a semiconductor chip according to an embodiment. FIG. 16 is a plan view illustrating a semiconductor structure provided in a key region of FIG. 15. FIGS. 17A, 17B, 17C, and 17D are cross-sectional views along lines A-A', B-B', C-C', and D-D' of FIG. 16, respectively.

Referring to FIG. 15, the semiconductor chip may include the chip region CHR, which is provided on the substrate SUB, and a scribe line CSL, which is cut along sides of the chip region CHR. The substrate SUB may be a portion of the diced semiconductor wafer. The substrate SUB may support the chip region CHR.

The chip region CHR may include first to fourth borders CB1-CB4. The first to fourth borders CB1-CB4 may be defined between the cut scribe line CSL and a main chip MC. The cut scribe line CSL may be provided to enclose, e.g., completely surround in a top view, the first to fourth borders CB1-CB4 of the main chip MC. In an embodiment, the chip region CHR may include a semiconductor memory cell (e.g., a DRAM cell).

The cut scribe line CSL may include the key region KER, which is adjacent to one of the first to fourth borders CB1-CB4 of the main chip MC. In other words, the key region KER may be left on the cut scribe line CSL, after a process of dicing a wafer. The key region KER may include an overlay key structure, which will be described below.

The key region KER in the cut scribe line CSL will be described in more detail with reference to FIGS. 16 and 17A to 17D. A device isolation layer ST may be provided on the substrate SUB to define dummy active patterns ACT. As an example, the substrate SUB may be a semiconductor substrate that is formed of or includes silicon, germanium, or silicon-germanium. The device isolation layer ST may include a silicon oxide layer.

In the present embodiment, the key structure (i.e., the semiconductor structure) on the key region KER may have substantially the same or similar structure as the memory cell, which is provided in the chip region CHR of FIG. 15. However, the key structure in the present embodiment may be an overlay key, which is not used as an actual memory cell and is used to measure an overlay value. Thus, to make a distinction with the memory cell of the chip region CHR, a pattern formed on the key region KER will be denoted with a term "dummy".

The dummy active patterns ACT may be formed by patterning an upper portion of the substrate SUB. Each of the dummy active patterns ACT may be extended in a fourth direction D4 that is parallel to the top surface of the substrate SUB. In other words, each of the dummy active patterns ACT may have a long axis in the fourth direction D4. The dummy active patterns ACT may be two-dimensionally arranged in the first and second directions D1 and D2. The dummy active patterns ACT may be spaced apart from each other in the fourth direction D4.

Each of the dummy active patterns ACT may have a decreasing width in a direction (i.e., a third direction D3) perpendicular to the top surface of the substrate SUB. In other words, the width of each of the dummy active patterns ACT may decrease as a distance from a bottom surface of the substrate SUB increases.

First and second trenches TR1 and TR2 may be defined between the dummy active patterns ACT. The device isolation layer ST may fill the first and second trenches TR1 and TR2 between the dummy active patterns ACT. The first trench TR1 may be defined between a pair of the dummy active patterns ACT, which are adjacent to each other in the second direction D2. The second trench TR2 may be defined between a pair of the dummy active patterns ACT, which are adjacent to each other in the fourth direction D4.

A distance between the pair of the dummy active patterns ACT, which are adjacent to each other in the second direction D2, may be smaller than a distance between the pair of the dummy active patterns ACT, which are adjacent to each other in the fourth direction D4. Accordingly, the second trench TR2 may be deeper than the first trench TR1. In other words, a bottom of the second trench TR2 may be lower than a bottom of the first trench TR1.

An upper portion of each of the dummy active patterns ACT may include a first impurity region SD1 and a pair of second impurity regions SD2. The first impurity region SD1 may be located between a pair of the second impurity regions SD2. For example, one of the second impurity regions SD2, the first impurity region SD1, and the other one of the second impurity regions SD2 may be sequentially arranged in the fourth direction D4, when viewed in a plan view.

Figure 17A:
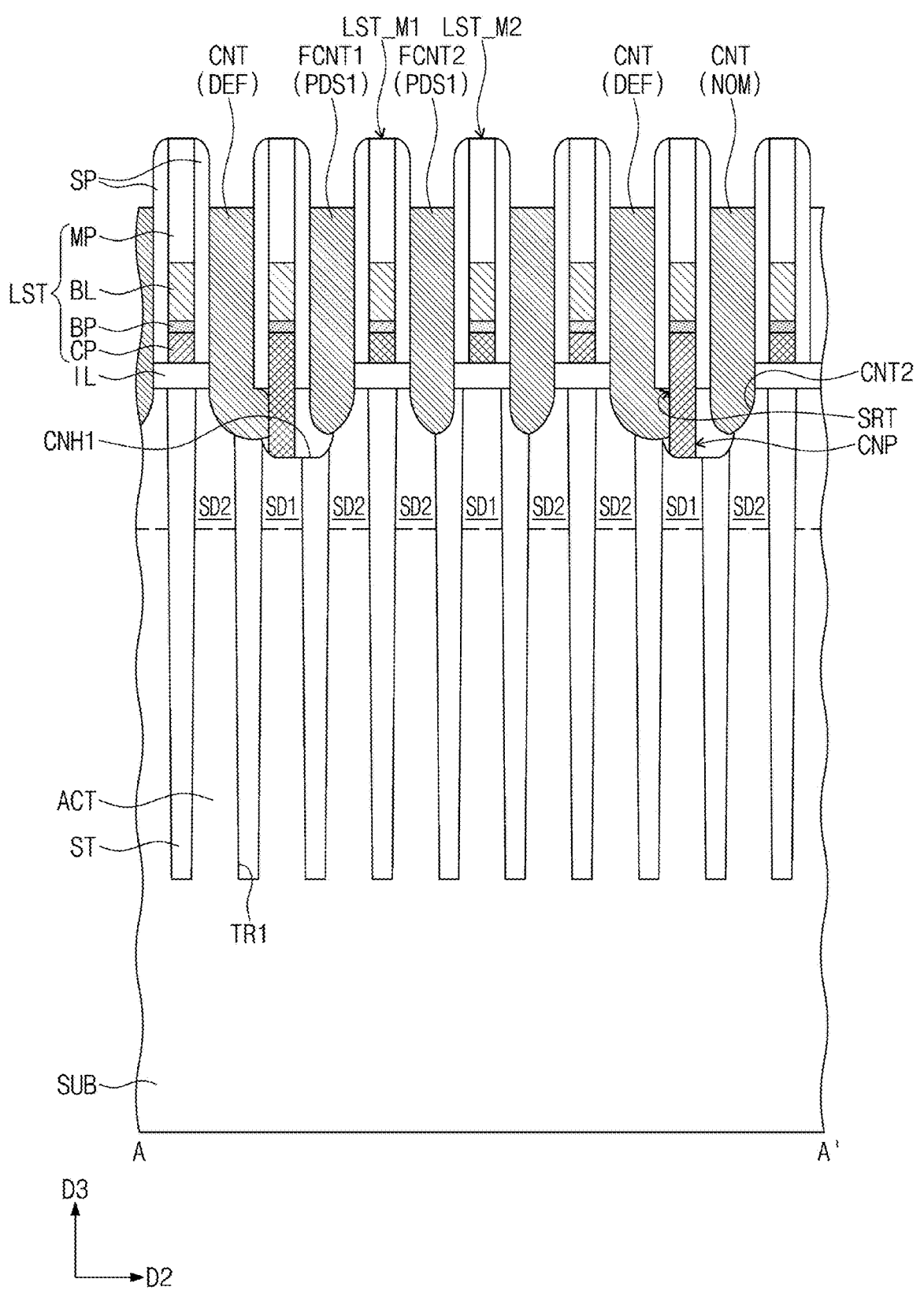
FIGS. 17A, 17B, 17C, and 17D are sectional views, which are respectively taken along lines A-A', B-B', C-C', and D-D' of FIG. 16.
Figure 17B:
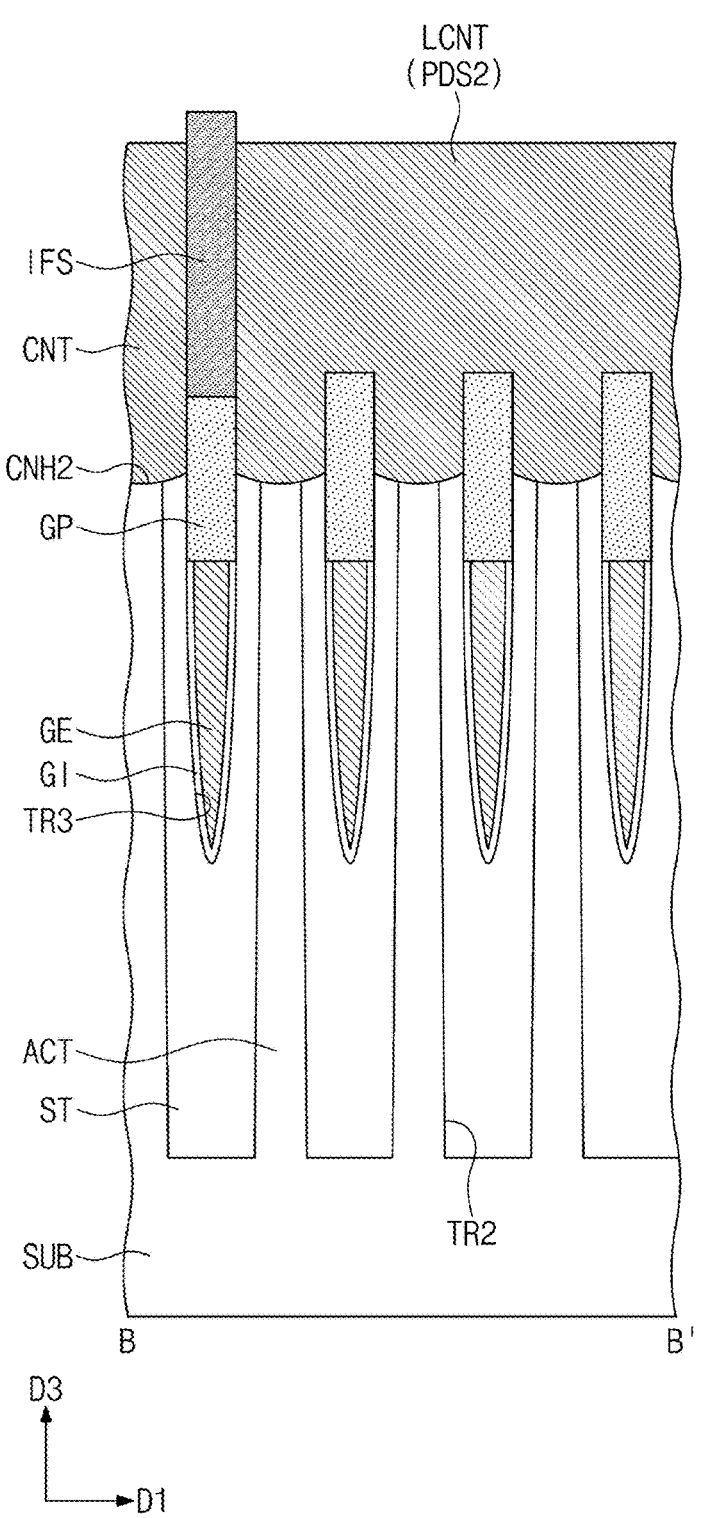
Figure 17C:
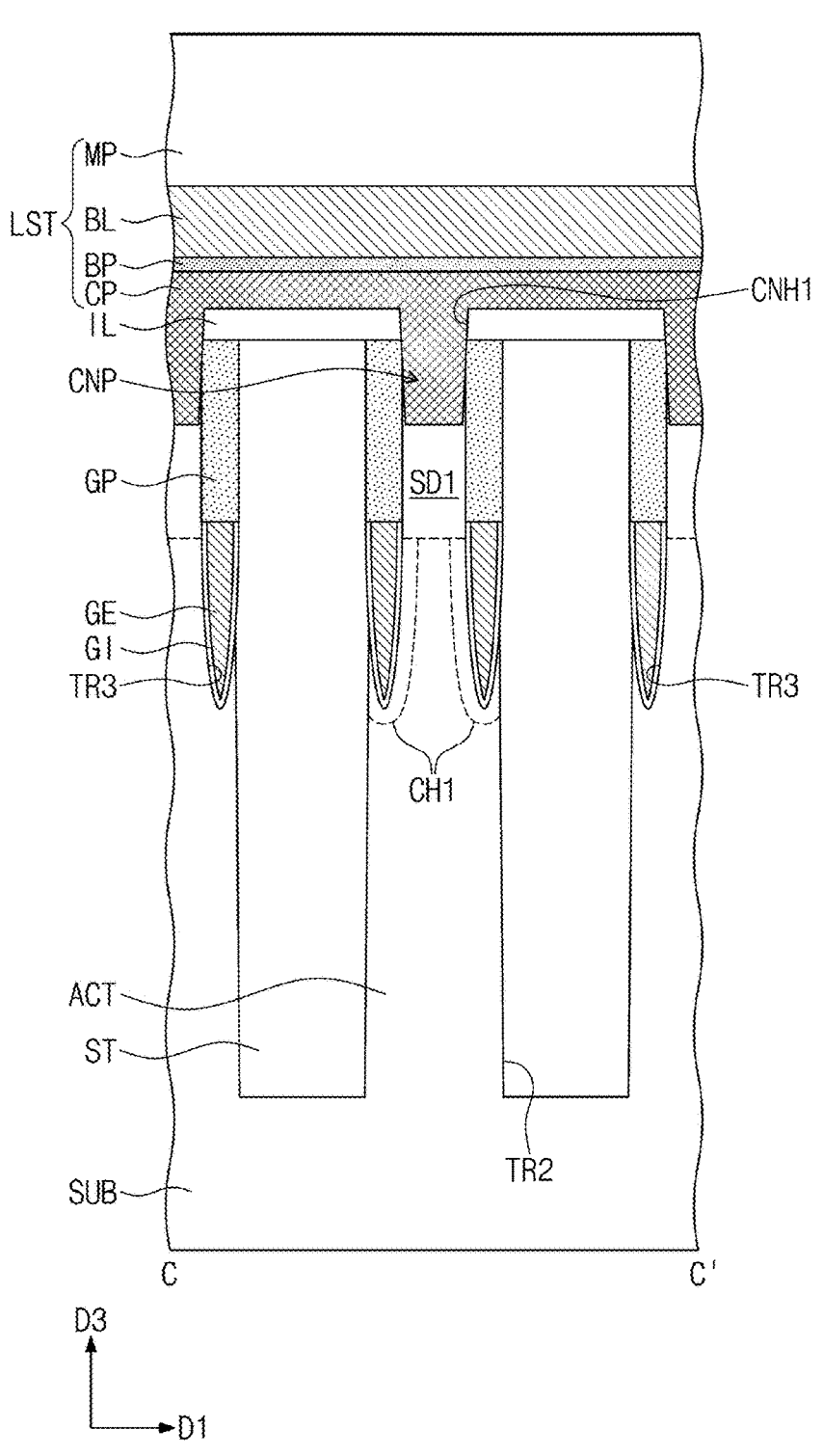
Figure 17D:
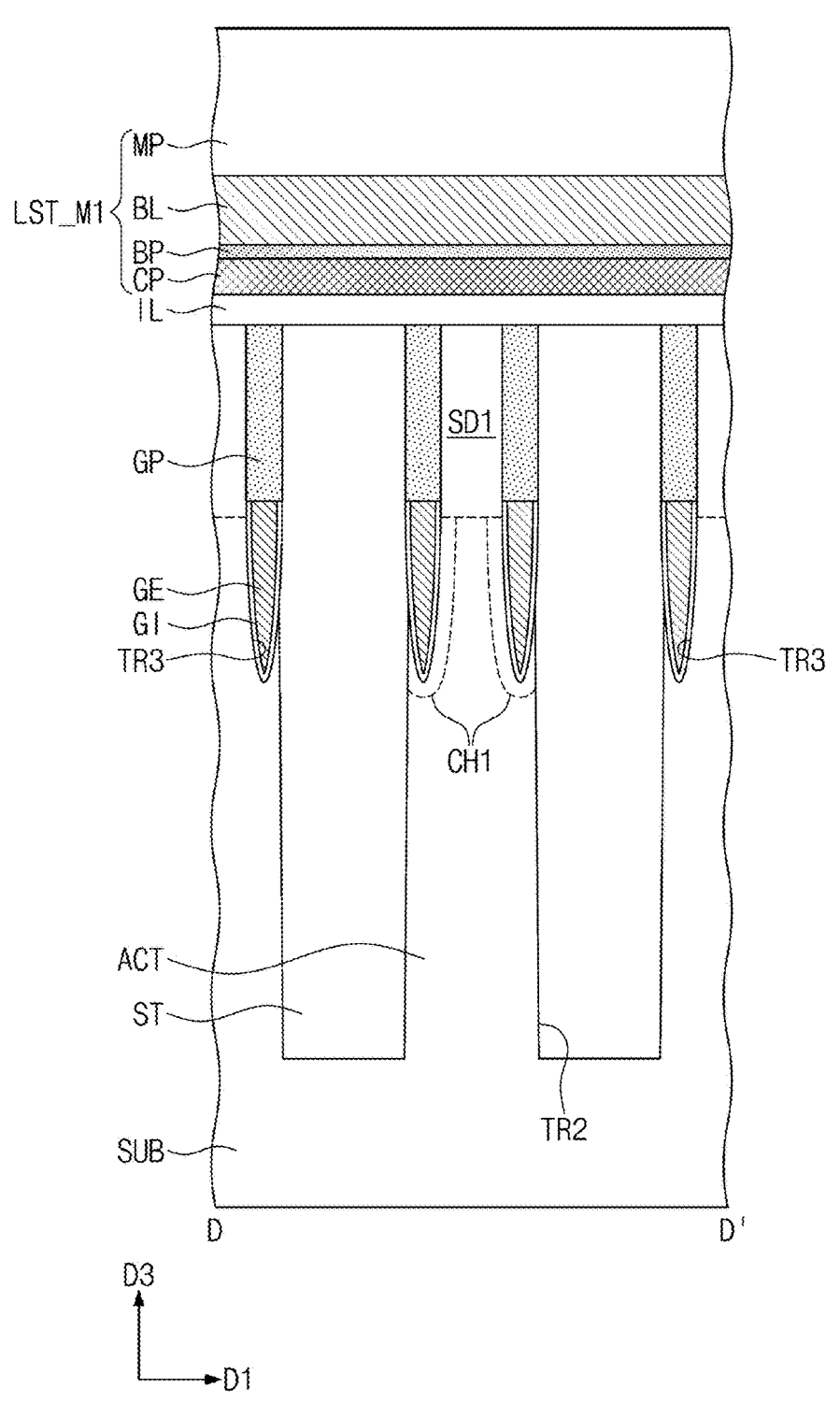

A pair of third trenches TR3 may be defined in the upper portion of each of the dummy active patterns ACT (e.g., see FIG. 17C). Each of the third trenches TR3 may be defined between the first impurity region SD1 and the second impurity region SD2. The third trench TR3 may be formed to penetrate an upper portion of the dummy active pattern ACT and may be extended from a top surface of the dummy active pattern ACT toward the bottom surface of the substrate SUB in a downward direction. A bottom of the third trench TR3 may be higher than those of the first and second trenches TR1 and TR2.

The upper portion of each of the dummy active patterns ACT may further include a pair of dummy channel regions CH1. When viewed in a plan view, the dummy channel region CH1 may be interposed between the first impurity region SD1 and the second impurity region SD2. The dummy channel region CH1 may be located below the third trench TR3. Thus, the dummy channel region CH1 may be located at a level lower than the first and second impurity regions SD1 and SD2.

Dummy gate electrodes GE may be provided to cross the dummy active patterns ACT and the device isolation layer ST. The dummy gate electrodes GE may be provided in the third trenches TR3, respectively. The dummy gate electrodes GE may be extended in the second direction D2 and parallel to each other. A pair of the dummy gate electrodes GE may be provided on the pair of dummy channel regions CH1 of the dummy active pattern ACT. In other words, when viewed in a plan view, the dummy gate electrode GE may be interposed between the first impurity region SD1 and the second impurity region SD2. A top surface of the dummy gate electrode GE may be lower than the top surface of the dummy active pattern ACT (e.g., a top surface of the first or second impurity region SD1 or SD2).

Referring back to FIG. 17C, an upper portion of the dummy gate electrode GE may be adjacent to the first impurity region SD1 of the dummy active pattern ACT. A lower portion of the dummy gate electrode GE may be adjacent to the dummy channel region CH1.

Referring back to FIGS. 16 and 17A to 17D, a gate dielectric layer GI may be interposed between the dummy gate electrode GE and the dummy active pattern ACT. A gate capping layer GP may be provided on the dummy gate electrode GE. The gate capping layer GP may cover the top surface of the dummy gate electrode GE. A top surface of the gate capping layer GP may be coplanar with the top surface of the dummy active pattern ACT.

For example, the dummy gate electrode GE may be formed of or include at least one of conductive metal nitride materials (e.g., titanium nitride or tantalum nitride), and/or metallic materials (e.g., titanium, tantalum, tungsten, copper, or aluminum). The gate dielectric layer GI may be formed of or include at least one of, e.g., silicon oxide, silicon nitride, silicon oxynitride, and/or high-k dielectric materials. In an embodiment, the high-k dielectric materials may include, e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or combinations thereof. The gate capping layer GP may include, e.g., a silicon oxide layer, a silicon nitride layer, and/or a silicon oxynitride layer.

An insulating layer IL may be provided on the substrate SUB. The insulating layer IL may include first contact holes CNH1, which are respectively formed to expose the first impurity regions SD1 of the dummy active patterns ACT. For example, the insulating layer IL may include a first insulating layer and a second insulating layer, which are sequentially stacked. The second insulating layer may have a dielectric constant higher than the first insulating layer. For example, the first insulating layer may include a silicon oxide layer, and the second insulating layer may include a silicon oxynitride layer.

In an embodiment, first contact holes CNH1 in the key region KER of FIG. 16 may have a programmed misalignment in the second direction D2 (in S212), as previously described with reference to FIGS. 4 and 7. In other words, each of the first contact holes CNH1 may not be normally aligned to the first impurity region SD1 but may be offset in the second direction D2.

In another embodiment, line structures LST, which will be described below, may also be provided to have the programmed misalignment described with reference to FIGS. 4 and 7. In order to reduce complexity in the drawings and description, the present embodiment refers to an example, in which the first contact holes CNH1 are misaligned.

The line structures LST, which are extended in the first direction D1 to be parallel to each other, may be provided on the insulating layer IL. The line structures LST may be arranged in the second direction D2. When viewed in a plan view, the line structures LST may be provided to cross the dummy gate electrodes GE perpendicularly (e.g., see FIG. 16).

Since, as described above, the first contact holes CNH1 are formed to be offset in the second direction D2, there may be a slight misalignment between the line structure LST and the first contact hole CNH1 corresponding thereto. For example, referring to FIGS. 16 and 17A, while the line structure LST and the first contact hole CNH1 may vertically overlap, centers thereof may be horizontally offset from each other along the second direction D2.

A pair of spacers SP may be provided on opposite side surfaces of each of the line structures LST. The spacers SP may be formed of or include at least one of, e.g., silicon oxide, silicon nitride, and/or silicon oxynitride.

Each of the line structures LST may include a conductive pattern CP, a barrier pattern BP, a dummy bit line BL, and a mask pattern MP, which are sequentially stacked. The conductive pattern CP may include a contact portion CNP, which is provided to fill the first contact hole CNH1 and is coupled to the first impurity region SD1. More specifically, the contact portion CNP may be provided to penetrate the insulating layer IL and may be extended toward the bottom surface of the substrate SUB. The contact portion CNP may be in direct contact with the first impurity region SD1. The barrier pattern BP may prevent or suppress a metallic material in the dummy bit line BL from being diffused into the conductive pattern CP. The dummy bit line BL may be electrically connected to the first impurity region SD1 through the barrier pattern BP and the conductive pattern CP.

The conductive pattern CP may be formed of or include at least one of doped semiconductor materials (e.g., doped silicon or doped germanium). The barrier pattern BP may be formed of or include at least one of conductive metal nitride materials (e.g., titanium nitride or tantalum nitride). The dummy bit line BL may be formed of or include at least one of metallic materials (e.g., titanium, tantalum, tungsten, copper, or aluminum).

A plurality of insulating fences IFS may be provided on the gate capping layer GP (e.g., see FIGS. 16 and 17B). Each of the insulating fences IFS may be provided to penetrate the insulating layer IL and may be extended to an upper portion of the gate capping layer GP.

Referring back to FIG. 16, the insulating fences IFS may be two-dimensionally arranged in the first and second directions D1 and D2. In detail, the insulating fences IFS may be provided on the gate capping layer GP extending in the second direction D2 and may be arranged in the second direction D2. The insulating fences IFS and the line structures LST may be alternately arranged in the second direction D2.

Dummy contacts CNT may be provided to penetrate the insulating layer IL and may be coupled to the second impurity regions SD2, respectively. Each of the dummy contacts CNT may fill a second contact hole CNH2, which is formed by partially etching an upper portion of the second impurity region SD2. Referring back to FIG. 17A, the dummy contact CNT may be in contact with the second impurity region SD2, which is exposed through the second contact hole CNH2. In addition, the dummy contact CNT may be in contact with a side surface of the spacer SP and a top surface of the device isolation layer ST. The dummy contact CNT may be spaced apart from the line structure LST adjacent thereto by the spacer SP.

For example, each of the dummy contacts CNT may be formed of or include at least one of doped semiconductor materials (e.g., doped silicon or doped germanium), conductive metal nitride materials (e.g., titanium nitride or tantalum nitride), and/or metallic materials (e.g., titanium, tantalum, tungsten, copper, or aluminum).

Referring back to FIG. 16, the dummy contacts CNT may be two-dimensionally arranged in the first and second directions D1 and D2. In detail, the dummy contacts CNT and the line structures LST may be alternately arranged in the second direction D2. The dummy contacts CNT and the insulating fences IFS may be alternately arranged in the first direction D1.

Referring back to FIGS. 16 and 17A, since the first contact holes CNH1 on the key region KER are offset in the second direction D2, there may be a failure SRT, in which a lower portion of the dummy contact CNT is in contact with the contact portion CNP of the line structure LST. In detail, since the first contact hole CNH1 is offset in the second direction D2, the spacer SP between the lower portion of the dummy contact CNT and the contact portion CNP of the line structure LST may be formed to have a very small thickness, and this may lead to the failure in which the lower portion of the dummy contact CNT is in contact with the contact portion CNP. For example, the afore-described failure SRT may occur in even numbered ones CNT DEF of the dummy contacts CNT, which are arranged in the second direction D2, but may not occur in odd-numbered ones CNT NOM.

According to an embodiment, the dummy contacts CNT may include a first mark structure PDS1 and a second mark structure PDS2, which are respectively formed by the first and second programmed marks PDG1 and PDG2 in the layout LAY described with reference to FIG. 13.

Referring back to FIGS. 16 and 17B, the second mark structure PDS2 may have a line shape extending in the second direction D2. The insulating fences IFS may be omitted in the second mark structure PDS2. Thus, the second mark structure PDS2 may include a plurality of long contacts LCNT. The long contacts LCNT may be arranged in the second direction D2 to constitute the second mark structure PDS2.

The long contact LCNT may have a bar shape extending in the first direction D1. An extension length of the long contact LCNT may be larger than that of the dummy contact CNT. Each long contact LCNT may be connected to a plurality of the dummy active patterns ACT, which are arranged in the first direction D1. The long contact LCNT may be adjacent to at least two first contact holes CNH1. Owing to the afore-described failure, a lower portion of the long contact LCNT may be connected to the contact portion CNP in at least one of two first contact holes CNH1. Accordingly, the long contact LCNT is electrically connected to the line structure LST adjacent thereto, necessarily.

Referring back to FIGS. 16, 17A, and 17D, the first mark structure PDS1 may have a line shape extending in the first direction D1. The first mark structure PDS1 may include a first programmed line structure LST_M1 and a second programmed line structure LST_M2. The first contact holes CNH1 may not be formed in the first and second programmed line structures LST_M1 and LST_M2. Accordingly, the contact portions CNP, which are coupled to the first impurity regions SD1, may be completely omitted from the first and second programmed line structures LST_M1 and LST_M2. The first and second programmed line structures LST_M1 and LST_M2 may be vertically spaced apart from the substrate SUB by the insulating layer IL (e.g., see FIG. 17D).

The first mark structure PDS1 may include first programmed contacts FCNT1, which are disposed at a side of the first programmed line structure LST_M1. The first programmed contacts FCNT1 may be arranged in the first direction D1. The first mark structure PDS1 may include second programmed contacts FCNT2, which are disposed at a side of the second programmed line structure LST_M2. The second programmed contacts FCNT2 may be arranged in the first direction D1.

Since the contact portions CNP are completely omitted from the first and second programmed line structures LST_M1 and LST_M2, the first and second programmed contacts FCNT1 and FCNT2 may be prevented from being connected to the first and second programmed line structures LST_M1 and LST_M2. Accordingly, the dummy contacts CNT may include the programmed contacts FCNT1 and FCNT2, which are prevented from being connected to the line structure LST, regardless of an overlay value. The first and second programmed line structures LST_M1 and LST_M2 may constitute the first mark structure PDS1 in the first direction D1.

In an embodiment, the long contact LCNT of the second mark structure PDS2, which is overlapped with the first mark structure PDS1, may not be connected to the first and second programmed line structures LST_M1 and LST_M2.

Figure 18:
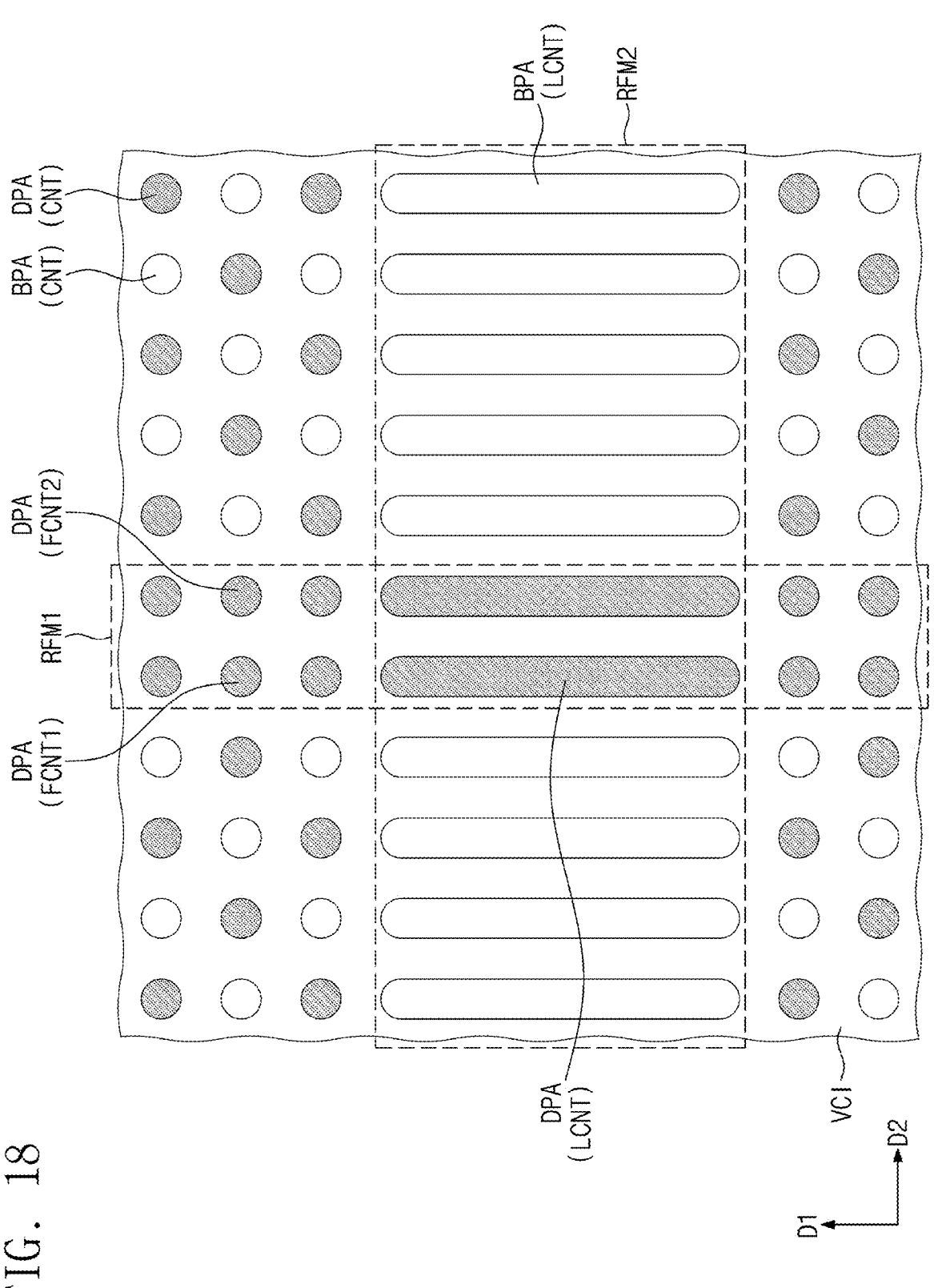
FIG. 18 is a voltage contrast (VC) image of the key region of FIG. 16.

FIG. 18 is a voltage contrast (VC) image of the key region of FIG. 16. The VC image VCI for the key region KER of FIG. 16 is exemplarily illustrated in FIG. 18. The VC image VCI may include signals of the dummy contacts CNT. The bright pattern BPA of the VC image VCI may be a signal of the dummy contact CNT electrically connected to the line structure LST. The dark pattern DPA of the VC image VCI may be a signal of the dummy contact CNT, which is not connected to the line structure LST.

In the present embodiment, the VC image VCI may include the first reference mark RFM1, which is extended in the first direction D1, and the second reference mark RFM2, which is extended in the second direction D2. The first reference mark RFM1 may be a signal of the first mark structure PDS1 of FIG. 16 described above. The first reference mark RFM1 may include only the dark patterns DPA that are signals of the first and second programmed contacts FCNT1 and FCNT2. The second reference mark RFM2 may be a signal of the second mark structure PDS2 of FIG. 16 described above. The second reference mark RFM2 may include only the bright patterns BPA that are signals of the long contacts LCNT.

As previously described with reference to FIG. 13, the first and second reference marks RFM1 and RFM2, which are absolutely, e.g., and always, bright or dark, may be inserted in the VC image VCI through the first and second mark structures PDS1 and PDS2 of the key region KER. Since the first and second reference marks RFM1 and RFM2 are provided to cross each other, they may be used as an indicator providing reference coordinates. Accordingly, it may be possible to match the VC image VCI with the layout LAY accurately and to measure an overlay value quickly and precisely. The measured overlay value may be fed back to the MRC step (in S32 of FIG. 2).

The same processes as that for the chip region CHR may be additionally performed on the key structure described with reference to FIGS. 16 and 17A to 17D. Accordingly, additional layers (e.g., metal layers) may be provided on the dummy contacts CNT and the line structures LST.

The second mark structure PDS2 according to an embodiment may be formed by omitting four lines of the insulating fences IFS. For example, the second mark structure PDS2 may be simply realized by omitting the formation of the insulating fences IFS on four dummy gate electrodes GE arranged side by side.

The first mark structure PDS1 according to an embodiment may be formed by omitting the first contact holes CNH1 below the first and second programmed line structures LST_M1 and LST_M2. For example, by removing the first contact holes CNH1 arranged in a zigzag manner in the first direction D1, it may be possible to simply realize the first mark structure PDS1.

According to an embodiment, the formation of the first and second mark structures PDS1 and PDS2 may not change processes that are performed on the chip region CHR. For example, in a photolithography process, which is performed on the chip region CHR, the mark structure may be formed by omitting some patterns from a region on the key region KER.

According to an embodiment, it may be possible to selectively form the first and second mark structures PDS1 and PDS2 on the key region KER, without changing the fabrication processes to be performed on the chip region CHR. Thus, it may be possible to realize a highly-accurate overlay key structure while preventing a memory cell on the chip region CHR from being affected by the formation of the overlay key structure.

In an overlay measuring method according to an embodiment, a reference mark, which is used as an indicator giving reference coordinates in a VC image, may be added to reduce a stage inaccuracy issue in a scanning electron microscope (SEM) system and a distortion issue in a SEM image. Accordingly, it may be possible to measure an overlay quickly and accurately.

According to an embodiment, an overlay key structure may include a mark structure, which is used to insert a reference mark in a VC image. The mark structure may be formed without changing a semiconductor fabrication process performed on a chip region, and this makes it possible to improve reliability of the semiconductor device and the process efficiency in the fabrication process.

By way of summation and review, embodiments provide a method of measuring an overlay quickly and accurately. Embodiments also provide a semiconductor device with improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a key region;
at least one dummy active pattern on the key region, the at least one dummy active pattern including a first impurity region and a second impurity region;
at least one line structure on the first impurity region and extended in a first direction;
a dummy gate electrode between the first impurity region and the second impurity region, the dummy gate electrode extending in a second direction crossing the first direction; and
a dummy contact adjacent to a side of the at least one line structure, the dummy contact being connected to the second impurity region, and the dummy contact including a plurality of long contacts arranged in the second direction.

2. The semiconductor device as claimed in claim 1, wherein the at least one line structure includes a plurality of line structures arranged in the second direction, the plurality of long contacts and the plurality of line structures being alternately arranged in the second direction.

3. The semiconductor device as claimed in claim 2, wherein each of the plurality of long contacts is electrically connected to one of the plurality of line structures adjacent thereto.

4. The semiconductor device as claimed in claim 1, wherein:
the at least one dummy active pattern includes a plurality of dummy active patterns arranged in the first direction, and
each of the plurality of long contacts has a bar shape extending in the first direction, each of the plurality of long contacts being electrically connected to a corresponding one of the plurality of dummy active patterns.

5. The semiconductor device as claimed in claim 1, wherein the at least one line structure includes a contact portion electrically connected to the first impurity region, the contact portion being in a contact hole exposing the first impurity region, and the contact hole being offset from the first impurity region in the second direction.

6. The semiconductor device as claimed in claim 1, wherein:
the dummy contact includes a first dummy contact and a second dummy contact, the first dummy contact and the second dummy contact being at respective opposite sides of the at least one line structure in the second direction, the at least one line structure includes a contact portion electrically connected to the first impurity region, a lower portion of the first dummy contact is electrically connected to the contact portion, and the second dummy contact is electrically disconnected from the contact portion.

7. The semiconductor device as claimed in claim 1, wherein the plurality of long contacts have voltage contrast signals that are displayed to be always bright when an e-beam inspection is performed thereon.

8. The semiconductor device as claimed in claim 1, wherein:

the at least one line structure includes a programmed line structure electrically disconnected from the first impurity region, the dummy contact includes a plurality of programmed contacts, which are arranged along a side of the programmed line structure and in the first direction, and the plurality of programmed contacts are electrically disconnected from the programmed line structure.

9. The semiconductor device as claimed in claim 8, wherein the plurality of programmed contacts have voltage contrast signals that are displayed to be always dark when an e-beam inspection is performed thereon.

10. The semiconductor device as claimed in claim 8, wherein:

the plurality of programmed contacts constitute a first mark structure extending in the first direction, the plurality of long contacts constitute a second mark structure extending in the second direction, and the first mark structure and the second mark structure cross each other.

11. A semiconductor device, comprising:

a substrate including a key region;

lower conductive patterns on the key region; and upper conductive patterns adjacent to the lower conductive patterns, the upper conductive patterns including:

first programmed conductive patterns arranged in a first direction and constitute a first mark structure extending in the first direction, and second programmed conductive patterns arranged in a second direction and constitute a second mark structure extending in the second direction, wherein the first mark structure and the second mark structure cross each other, each of the first mark structure and the second mark structure has a voltage contrast signal that is displayed to be always bright or always dark when an e-beam inspection is performed thereon.

12. The semiconductor device as claimed in claim 11, wherein all of the first programmed conductive patterns are electrically connected to corresponding ones of the lower conductive patterns, respectively.

13. The semiconductor device as claimed in claim 11, wherein all of the first programmed conductive patterns are electrically disconnected from corresponding ones of the lower conductive patterns, respectively.

14. The semiconductor device as claimed in claim 11, wherein all of the second programmed conductive patterns are electrically connected to corresponding ones of the lower conductive patterns, respectively.

15. The semiconductor device as claimed in claim 11, wherein all of the second programmed conductive patterns are electrically disconnected from corresponding ones of the lower conductive patterns, respectively.

16. A semiconductor device, comprising:

a substrate including a key region;

lower conductive patterns on the key region; and upper conductive patterns adjacent to the lower conductive patterns, the upper conductive patterns including:

a dummy conductive pattern electrically connected to or disconnected from a corresponding one of the lower conductive patterns, and at least one first programmed conductive pattern electrically connected to a corresponding one of the lower conductive patterns, the at least one first programmed conductive pattern including a plurality of first programmed conductive patterns arranged along a first direction, and the plurality of first programmed conductive patterns constituting a first mark structure extending in the first direction.

17. The semiconductor device as claimed in claim 16, wherein each of the plurality of first programmed conductive patterns has an extension length that is greater than the dummy conductive pattern.

18. The semiconductor device as claimed in claim 16, wherein:

the upper conductive patterns further includes at least one second programmed conductive pattern electrically disconnected from a corresponding one of the lower conductive patterns, the at least one second programmed conductive pattern includes a plurality of second programmed conductive patterns arranged in a second direction crossing the first direction, and the plurality of second programmed conductive patterns constitute a second mark structure extending in the second direction.

19. The semiconductor device as claimed in claim 18, wherein:

the dummy conductive pattern has a voltage contrast (VC) signal that is displayed to be bright or dark when an e-beam inspection is performed thereon, the first mark structure has the VC signal that is displayed to be always bright, and the second mark structure has the VC signal that is displayed to be always dark.

20. The semiconductor device as claimed in claim 19, wherein the first mark structure and the second mark structure are used as a reference mark of the VC signal.

* * * * *